(12) United States Patent
Cho et al.

(10) Patent No.: US 12,082,435 B2
(45) Date of Patent: *Sep. 3, 2024

(54) DISPLAY DEVICE AND METHOD OF MANUFACTURING DISPLAY DEVICE

(71) Applicant: SAMSUNG DISPLAY CO., LTD., Yongin-si (KR)

(72) Inventors: Jaeseol Cho, Seoul (KR); Chungi You, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/362,935

(22) Filed: Jul. 31, 2023

(65) Prior Publication Data

US 2023/0389351 A1   Nov. 30, 2023

Related U.S. Application Data

(63) Continuation of application No. 17/315,137, filed on May 7, 2021, now Pat. No. 11,716,869.

(30) Foreign Application Priority Data

Sep. 2, 2020  (KR) .......................... 10-2020-0111591

(51) Int. Cl.
*H10K 50/818*   (2023.01)
*H10K 59/124*   (2023.01)
(Continued)

(52) U.S. Cl.
CPC ......... *H10K 50/818* (2023.02); *H10K 59/124* (2023.02); *H10K 59/131* (2023.02);
(Continued)

(58) Field of Classification Search
None
See application file for complete search history.

(56) References Cited

U.S. PATENT DOCUMENTS 11,716,869 B2 *   8/2023   Cho ...................... H10K 50/824
                                                              257/43
2016/0020422 A1   1/2016   Kim et al.

FOREIGN PATENT DOCUMENTS

| CN | 110767828 B | 1/2023 |
| KR | 10-1397110 B1 | 5/2014 |
| KR | 10-2070148 B1 | 1/2020 |

* cited by examiner

*Primary Examiner* — Michael Lebentritt
(74) *Attorney, Agent, or Firm* — Lewis Roca Rothgerber Christie LLP

(57) ABSTRACT

A display device includes a substrate including a display area and a pad area, a lower electrode, a light emitting layer, an upper electrode on the light emitting layer, and a pad electrode in the pad area. The lower electrode is in the display area, the lower electrode including a first electrode, a second electrode, and a third electrode. The first electrode has a first etching rate with respect to an etching process. The second electrode is on the first electrode. The second electrode has a second etching rate with respect to the etching process that is higher than the first etching rate. The third electrode is on the second electrode. The third electrode has a third etching rate with respect to the etching process that is lower than the second etching rate and higher than the first etching rate. The light emitting layer is over the first electrode.

20 Claims, 19 Drawing Sheets

(51) Int. Cl.
*H10K 59/131* (2023.01)
*H10K 71/00* (2023.01)
*H10K 59/12* (2023.01)
*H10K 59/126* (2023.01)
*H10K 102/00* (2023.01)

(52) U.S. Cl.
CPC ............ *H10K 71/00* (2023.02); *H10K 71/621* (2023.02); *H10K 59/1201* (2023.02); *H10K 59/126* (2023.02); *H10K 2102/3026* (2023.02)

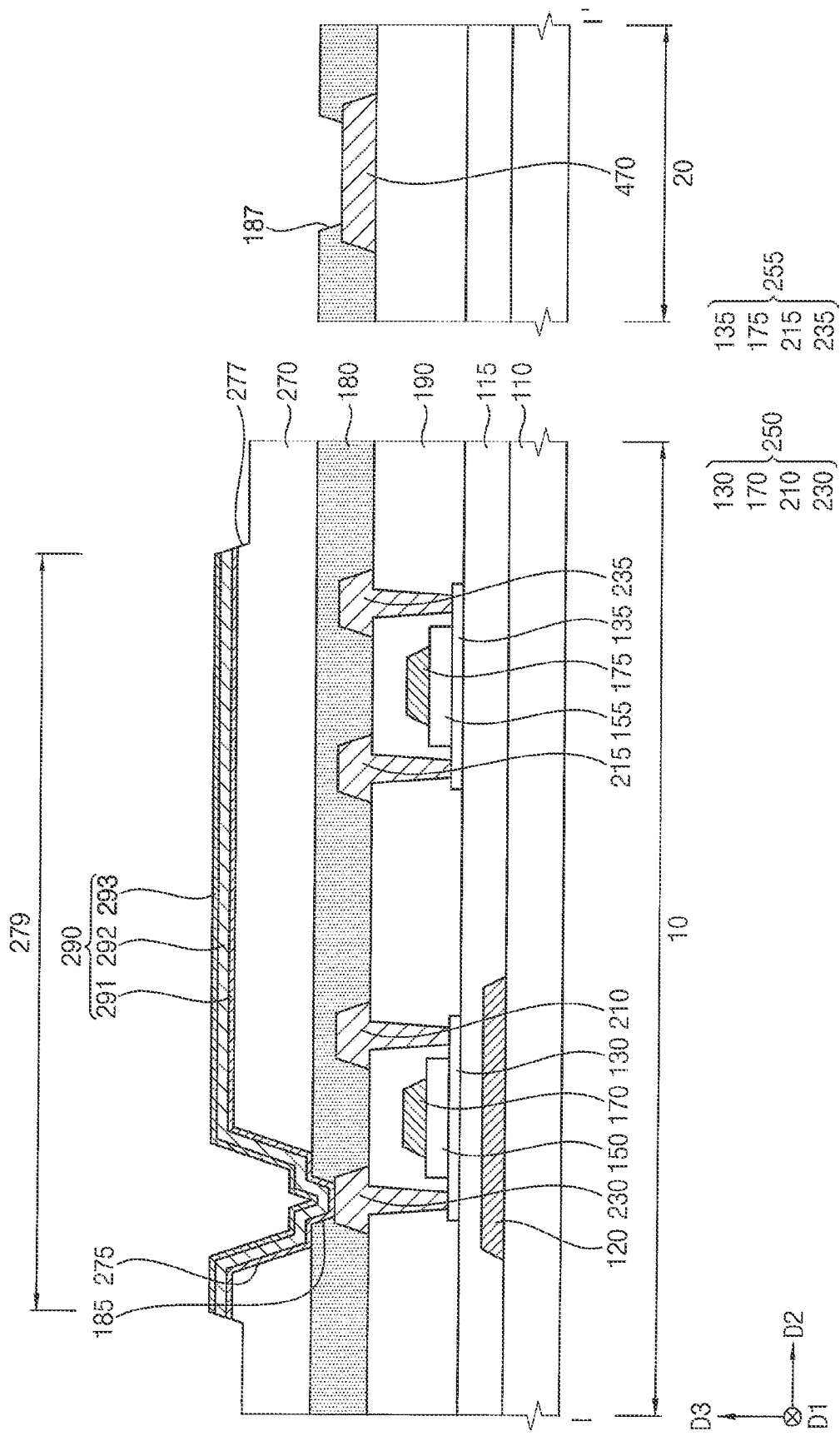

DISPLAY DEVICE AND METHOD OF MANUFACTURING DISPLAY DEVICE

CROSS-REFERENCE TO RELATED APPLICATIONS

This application is a continuation of U.S. patent application Ser. No. 17/315,137, filed May 7, 2021, which claims priority to and the benefit of Korean Patent Application No. 10-2020-0111591, filed Sep. 2, 2020, the entire content of both of which is incorporated herein by reference.

BACKGROUND

1. Field

Embodiments relate generally to a display device and a method of manufacturing a display device. More particularly, embodiments of the present disclosure relate to a display device including a pad electrode and a method of manufacturing a display device including a pad electrode.

2. Description of the Related Art

Flat panel display devices are used as display devices for replacing a cathode ray tube display device due to lightweight and thin characteristics thereof. As representative examples of such flat panel display devices, there are a liquid crystal display device and an organic light emitting diode display device.

The display device may include a display area in which pixel structures (e.g., a lower electrode, a light emitting layer, and an upper electrode) are disposed, and a pad area in which a pad electrode is disposed. In this case, the pixel structure may emit light to display an image on a top surface of the display device, and the pad electrode may be electrically connected to an external device configured to generate image signals provided to the pixel structure. In a process of forming the lower electrode of the display device, after a preliminary electrode layer is formed over a whole substrate, the lower electrode may be formed through a wet etching process. In this process, the preliminary electrode layer may be disposed on the pad electrode, and the pad electrode may be damaged during a process of etching the preliminary electrode layer disposed on the pad electrode.

SUMMARY

Aspects of one or more embodiments are directed towards a display device including a pad electrode.

Aspects of one or more embodiments are directed towards a method of manufacturing a display device including a pad electrode.

According to some embodiments, a display device includes a substrate, a lower electrode, a light emitting layer, an upper electrode, and a pad electrode. The substrate includes a display area and a pad area. The lower electrode is in the display area on the substrate, the lower electrode including a first electrode, a second electrode, and a third electrode. The first electrode has a first etching rate with respect to an etching process. The second electrode is on the first electrode. The second electrode has a second etching rate with respect to the etching process that is higher than the first etching rate. The third electrode is on the second electrode. The third electrode has a third etching rate with respect to the etching process that is lower than the second etching rate and higher than the first etching rate. The light emitting layer is over the first electrode. The upper electrode is on the light emitting layer. The pad electrode is in the pad area on the substrate.

In embodiments, the first electrode may include titanium (Ti), and the second electrode may include silver (Ag). The third electrode may include indium tin oxide (ITO).

In embodiments, the pad electrode may include a first metal layer and a second metal layer. The first metal layer may have a fourth etching rate with respect to the etching process. The second metal layer may be on the first metal layer. The second metal layer may have a fifth etching rate with respect to the etching process that is higher than the fourth etching rate.

In embodiments, the fourth etching rate may be equal to the first etching rate.

In embodiments, the pad electrode may further include a third metal layer on the second metal layer.

In embodiments, the third metal layer may have a sixth etching rate with respect to the etching process that is higher than the fourth etching rate. The sixth etching rate may be equal to the third etching rate.

In embodiments, the first metal layer may include titanium (Ti). The second metal layer may include copper (Cu). The third metal layer may include indium tin oxide (ITO).

In embodiments, the display device may further include a protective insulating layer in the display area and the pad area between the substrate and the lower electrode.

In embodiments, the protective insulating layer may expose a part of a top surface of the pad electrode.

In embodiments, the display device may further include a planarization layer between the substrate and the lower electrode.

In embodiments, the planarization layer may include a protrusion protruding in a direction from the substrate to the upper electrode.

In embodiments, the lower electrode may be on the protrusion.

In embodiments, the display device may further include a semiconductor element between the substrate and the lower electrode and a shielding metal layer between the semiconductor element and the substrate.

In embodiments, the semiconductor element may include a metal oxide semiconductor layer. The shielding metal layer may overlap the metal oxide semiconductor layer.

According to some embodiments, a method of manufacturing a display device is provided as follows. A substrate including a display area and a pad area is provided. A pad electrode is formed in the pad area on the substrate. A preliminary electrode layer including a stacked structure is formed on the substrate and the pad electrode. The stacked structure include a first electrode layer having a first etching rate with respect to an etching process, a second electrode layer having a second etching rate with respect to the etching process that is higher than the first etching rate, and a third electrode layer having a third etching rate with respect to the etching process that is lower than the second etching rate and higher than the first etching rate, and the first, second, and third electrode layers are sequentially stacked. The second and third electrode layers located in a first portion of the display area except for the preliminary electrode layer located in a second portion of the display area are removed through a first etching process. A lower electrode is formed by removing the first electrode layer located in the first portion except for the preliminary electrode layer located in the second portion of the display area through a second etching process. A light emitting layer is formed on the lower electrode. An upper electrode is formed on the light emitting layer.

In embodiments, the first etching process may include a wet etching process using an etchant including a phosphoric-acetic-nitric acid. The second etching process may include a dry etching process.

In embodiments, the first electrode layer may include titanium (Ti). The second electrode layer may include silver (Ag). The third electrode layer may include indium tin oxide (ITO).

In embodiments, the pad electrode may include a first metal layer, a second metal layer, and a third metal layer. The first metal layer may have a fourth etching rate with respect to the etching process. The second metal layer may be formed on the first metal layer. The second metal layer may have a fifth etching rate with respect to the etching process that is higher than the fourth etching rate. The third metal layer may be formed on the second metal layer. The third metal layer may have a sixth etching rate with respect to the etching process that is higher than the fourth etching rate. The fourth etching rate may be equal to the first etching rate. The sixth etching rate may be equal to the third etching rate.

In embodiments, the first metal layer may include titanium (Ti), and the second metal layer may include copper (Cu). The third metal layer may include indium tin oxide (ITO).

In embodiments, the method may further include forming a protective insulating layer in the display area and the pad area between the substrate and the lower electrode to expose a part of a top surface of the pad electrode, forming a planarization layer on the protective insulating layer, providing a second electrode and a third electrode to the second portion on the first electrode layer after the first etching process is performed, forming a protrusion protruding in a direction from the substrate to the lower electrode by removing a part of the planarization layer during the second etching process, and providing a first electrode to the second portion after the second etching process is performed. The lower electrode including the first electrode, the second electrode, and the third electrode may be formed on the protrusion.

Because the display device according to embodiments of the present disclosure includes the lower electrode having the stacked structure in which Ti, Ag, and ITO are stacked, an etchant used in the etching process for forming the lower electrode may not make contact with the pad electrode, and the pad electrode may not be etched by the etchant. Accordingly, a contact failure in which the pad electrode of the display device is not electrically connected to the external device may not occur.

In the method of manufacturing the display device according to embodiments of the present disclosure, the preliminary electrode layer has a stacked structure in which Ti, Ag, and ITO are stacked, so that the etchant used in the first etching process for forming the lower electrode may not make contact with the pad electrode, and the pad electrode may not be etched by the etchant.

BRIEF DESCRIPTION OF THE DRAWINGS

Embodiments can be understood in more detail from the following description taken in conjunction with the accompanying drawings.

FIGS. 4-18 are cross-sectional views showing a method of manufacturing a display device according to embodiments of the present disclosure.

DETAILED DESCRIPTION

Figure 1A:
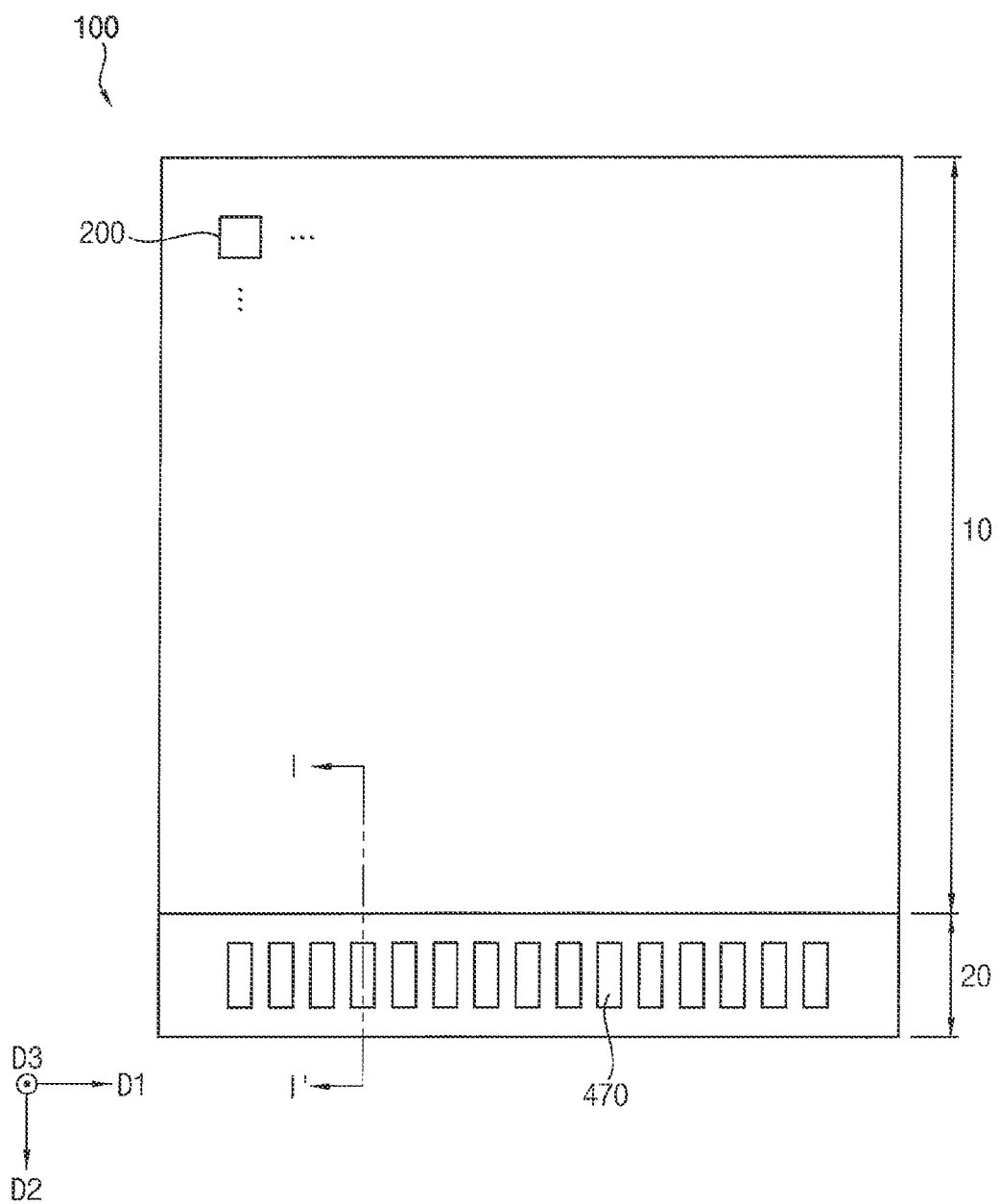
FIG. 1A is a plan view showing a display device according to embodiments of the present disclosure.

Hereinafter, a display device and a method of manufacturing a display device according to embodiments will be described in more detail with reference to the accompanying drawings. In the accompanying drawings, like reference numerals refer to like elements throughout, and duplicative descriptions thereof may not be provided.

The terminology used herein is for the purpose of describing particular example embodiments only and is not intended to limit the example embodiments described herein.

As used herein, the singular forms "a," "an," and "the" are intended to include the plural forms as well, unless the context clearly indicates otherwise.

It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

As used herein, expressions such as "at least one of," "one of," and "selected from," when preceding a list of elements, modify the entire list of elements and do not modify the individual elements of the list.

As used herein, the term "and/or" includes any and all combinations of one or more of the associated listed items.

Further, the use of "may" when describing embodiments of the present disclosure refers to "one or more embodiments of the present disclosure".

It will be understood that when an element is referred to as being "on" or "connected to" another element, it may be directly on or directly connected to the other element or one or more intervening elements may also be present. When an element is referred to as being "directly on" or "directly connected to" another element, there are no intervening elements present.

In the drawings, the relative sizes of elements, layers, and regions may be exaggerated and/or simplified for clarity. Spatially relative terms, such as "beneath," "below," "lower," "above," "upper," "bottom," "top," and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially," "about," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and refers to within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Unless otherwise defined, all terms (including technical and scientific terms) used herein have the same meaning as commonly understood by one of ordinary skill in the art to which this disclosure pertains. Terms, such as those defined in commonly used dictionaries, should be interpreted as having a meaning that is consistent with their meaning in the context of the relevant art and should not be interpreted in an idealized or overly formal sense, unless expressly so defined herein.

Figure 1B:
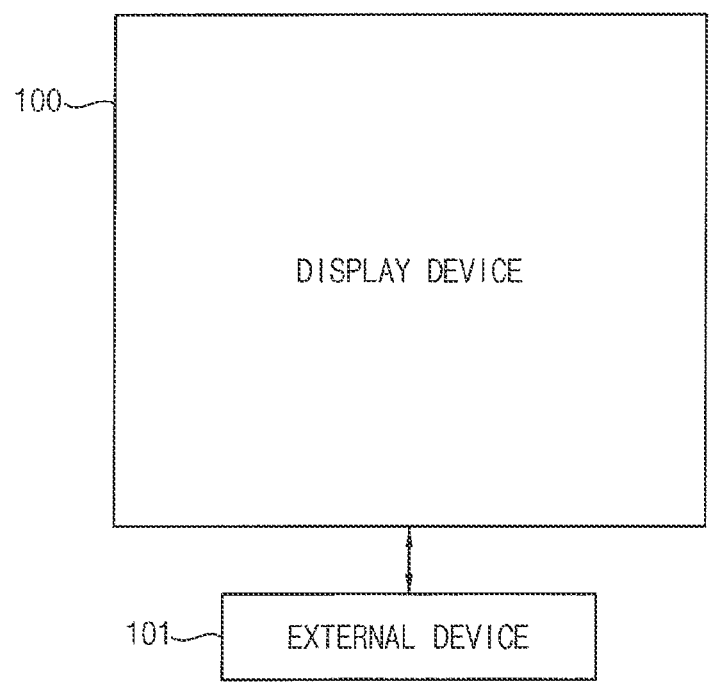
FIG. 1B is a block diagram showing an external device electrically connected to the display device of FIG. 1.

FIG. 1A is a plan view showing a display device according to embodiments of the present disclosure, and FIG. 1B is a block diagram showing an external device electrically connected to the display device of FIG. 1.

Referring to FIGS. 1A and 1B, a display device 100 (e.g., a substrate 110 of FIG. 2) may include a display area 10 and a pad area 20. Pixel structures 200 may be disposed in the display area 10, and pad electrodes 470 may be disposed in the pad area 20. The pixel structures 200 may be arranged over the display area 10 (e.g., the whole display area 10) in a first direction D1 parallel to a top surface of the display device 100 and in a second direction D2 crossing (e.g., perpendicular or orthogonal to) the first direction D1. An image may be displayed on the display area 10 through the pixel structure 200 capable of emitting light.

For example, the pixel structures 200 may include a red pixel structure, a green pixel structure, and a blue pixel structure. For example, the pixel structures 200 may be arranged by using an RGB stripe scheme in which rectangles having the same size are sequentially arranged, an S-stripe scheme including a blue pixel structure having a relatively large area, a WRGB scheme further including a white pixel structure, a PenTile® scheme (PENTILE® is a registered trademark of Samsung Display Co., Ltd., Republic of Korea) in which RG-GB patterns are repeatedly arranged, or the like.

The pad area 20 may be located on one side of the display area 10, and pad electrodes 470 connected (e.g., electrically connected) to an external device 101 may be disposed in the pad area 20. In other words, the pad electrodes 470 may be arranged in the first direction D1, and the pad electrodes 470 may connect (e.g., electrically connect) the external device 101 to the pixel structures 200.

The external device 101 may be connected (e.g., electrically connected) to the display device 100 through a printed circuit board (e.g., a flexible printed circuit board). For example, in the case of a flexible printed circuit board, one side of the flexible printed circuit board may make contact (e.g., direct contact) with the pad electrodes 470, and an opposite side of the flexible printed circuit board may make contact (e.g., direct contact) with the external device 101. The external device 101 may provide a data signal, a gate signal, an emission control signal, a gate initialization signal, an initialization voltage, a power supply voltage, and/or the like to the display device 100. In addition, a driver integrated circuit may be on (e.g., mounted on) the flexible printed circuit board. In other embodiments, the driver integrated circuit may be on (e.g., mounted on) the display device 100 adjacent to the pad electrodes 470.

However, although each of the display area 10 and the pad area 20 according to the present disclosure has been described as having a rectangular shape when viewed in a plan view, the shape is not limited thereto. For example, each of the display area 10 and the pad area 20 may have a triangular shape, a rhombic shape, a polygonal shape, a circular shape, a track shape, or an elliptical shape when viewed in a plan view.

In addition, although a width (breadth) of the pad area 20 in the first direction D1 has been shown in FIG. 1A as being equal or substantially equal to a width (breadth) of the display area 10 in the first direction D1, the configuration of the present disclosure is not limited thereto. For example, the width of the pad area 20 in the first direction D1 may be less than the width of the display area 10 in the first direction D1. In another embodiment, the width of the display area 10 in the first direction D1 may be less than the width of the pad area 20 in the first direction D1.

Figure 2:
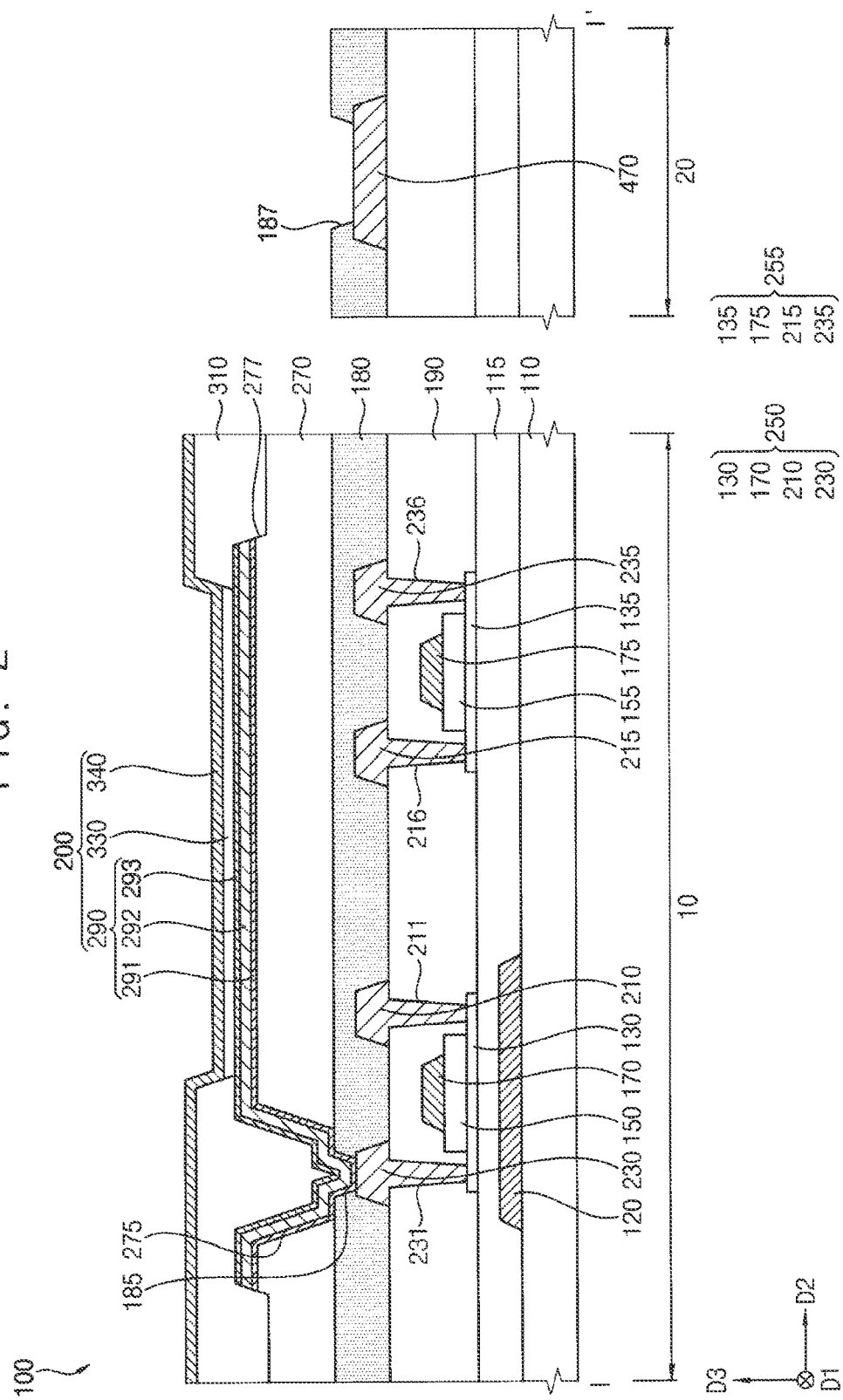
FIG. 2 is a cross-sectional view taken along the line I-I' of FIG. 1A.
Figure 3:
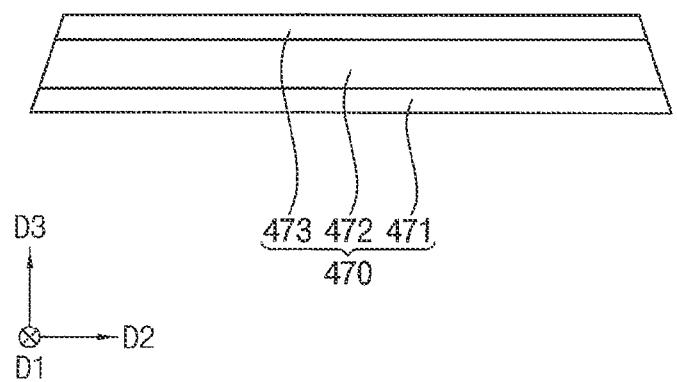
FIG. 3 is a cross-sectional view showing a pad electrode included in the display device of FIG. 2.

FIG. 2 is a cross-sectional view taken along the line I-I' FIG. 1A, and FIG. 3 is a cross-sectional view showing a pad electrode included in the display device of FIG. 2.

Referring to FIGS. 2 and 3, the display device 100 may include a substrate 110, a shielding metal layer 120, a buffer layer 115, a first semiconductor element 250, a second semiconductor element 255, a first gate insulating pattern 150, a second gate insulating pattern 155, an interlayer insulating layer 190, a pad electrode 470, a protective insulating layer 180, a planarization layer 270, a pixel structure 200, a pixel defining layer 310, and/or the like. In this case, the pixel structure 200 may include a lower electrode 290, a light emitting layer 330, and an upper electrode 340, and the lower electrode 290 may include a first electrode 291, a second electrode 292, and a third electrode 293. In addition, the pad electrode 470 may include a first metal layer 471, a second metal layer 472, and a third metal layer 473. Moreover, the first semiconductor element 250 may include a first active layer 130, a first gate electrode 170, a first source electrode 210, and a first drain electrode 230, and the second semiconductor element 255 may include a second active layer 135, a second gate electrode 175, a second source electrode 215, and a second drain electrode 235. In embodiments, the first electrode 291 may have a first etching rate with respect to an etch process, the second electrode 292 may have a second etching rate with respect to the etch process, and the third electrode 293 may have a third etching rate with respect to the etch process. In addition, the first metal layer 471 may have a fourth etching rate with respect to the etch process, the second metal layer 472 may have a fifth etching rate with respect to the etch process, and the third metal layer 473 may have a sixth etching rate with respect to the etch process.

The substrate 110 including a transparent material and/or opaque material may be provided. The substrate 110 may include a quartz substrate, a synthetic quartz substrate, a calcium fluoride substrate, a fluorine-doped quartz (F-doped quartz) substrate, a soda lime glass substrate, a non-alkali glass substrate, and/or the like.

In other embodiments, the substrate 110 may be a transparent resin substrate having flexibility. Non-limiting examples of the transparent resin substrate that may be used as the substrate 110 include a polyimide substrate. In this case, the polyimide substrate may have a stacked structure including a first polyimide layer, a barrier film layer, and a second polyimide layer.

The shielding metal layer 120 may be disposed in the display area 10 on the substrate 110. In other words, the shielding metal layer 120 may overlap (e.g., overlap in a third direction D3 or a thickness direction of the substrate 110) the first semiconductor element 250, and may be disposed between the first semiconductor element 250 and the substrate 110. The shielding metal layer 120 may block or substantially block external light passing through the substrate 110 in the third direction D3 normal perpendicular to the first and second directions D1 and D2, and may protect the first semiconductor element 250 from external light. In other embodiments, the shielding metal layer 120 may be connected to the first drain electrode 230. In this case, because the shielding metal layer 120 is equipotential to the first drain electrode 230, element characteristics of the first semiconductor element 250 may be improved. In still other embodiments, a set or preset voltage may be applied to the shielding metal layer 120. Because the voltage is applied to the shielding metal layer 120, the shielding metal layer 120 may reduce interference in driving of the first semiconductor element 250 that may be caused by electric charges included in the substrate 110. In yet other embodiments, the shielding metal layer 120 may be grounded at an outer periphery of the display device 100. In this case, the electric charges included in the substrate 110 may exit to an outside through the shielding metal layer 120. In other words, because the shielding metal layer 120 is grounded, the shielding metal layer 120 may reduce interference in driving of the first semiconductor element 250 that may be caused by the electric charges included in the substrate 110.

The shielding metal layer 120 may include a metal, a metal alloy, metal nitride, conductive metal oxide, a transparent conductive material, and/or the like. These materials may be used alone or in combination with each other. In some embodiments, the shielding metal layer 120 may have a multilayer structure including a plurality of metal layers. In some embodiments, the shielding metal layer 120 may further include a light blocking material to block or substantially block external light. The light blocking material may include carbon black, titanium nitride oxide, titanium black, phenylene black, aniline black, cyanine black, nigrosine acid black, a black resin, and/or the like.

The buffer layer 115 may be disposed in the display area 10 and the pad area 20 on the substrate 110 and the shielding metal layer 120. In other words, the buffer layer 115 may be disposed over the substrate 110 (e.g., the whole substrate). For example, the buffer layer 115 may cover (e.g., sufficiently cover) the shielding metal layer 120 on the substrate 110, and may have a flat or substantially flat top surface without creating a step around the shielding metal layer 120. Alternatively, the buffer layer 115 may be disposed along a profile of the shielding metal layer 120 with a uniform or substantially uniform thickness to cover the shielding metal layer 120 on the substrate 110. The buffer layer 115 may prevent or substantially prevent metal atoms or impurities from diffusing from the substrate 110 to the first semiconductor element 250, the second semiconductor element 255, and the pixel structure 200. In addition, when a surface of the substrate 110 is not uniform, the buffer layer 115 may serve to improve flatness of the surface of the substrate 110. Depending on a type (kind) of the substrate 110, at least two buffer layers 115 may be provided on the substrate 110, or the buffer layer 115 may not be provided. For example, in the case where the buffer layer 115 is provided, the buffer layer 115 may include an organic material and/or an inorganic material. In embodiments, the buffer layer 115 may include an inorganic material (e.g., may be an inorganic layer).

The first active layer 130 may be disposed in a first part of the display area 10 on the buffer layer 115. In other words, the first active layer 130 may be disposed on a part of the buffer layer 115 under which the shielding metal layer 120 is located. For example, the first active layer 130 may include a metal oxide semiconductor, amorphous silicon, poly silicon, an organic semiconductor, and/or the like. When the display device 100 is a large display device, the first active layer 130 may be a metal oxide semiconductor layer including a binary compound ($AB_x$), a ternary compound ($AB_xC_y$), a quaternary compound ($AB_xC_yD_z$), and/or the like that contains indium (In), zinc (Zn), gallium (Ga), tin (Sn), titanium (Ti), aluminum (Al), hafnium (Hf), zirconium (Zr), magnesium (Mg), and/or the like. For example, the first active layer 130 may include zinc oxide ($ZnO_x$), gallium oxide ($GaO_x$), titanium oxide ($TiO_x$), tin oxide ($SnO_x$), Indium oxide ($InO_x$), indium-gallium oxide (IGO), indium-zinc oxide (IZO), indium-tin oxide (ITO), gallium-zinc oxide (GZO), zinc-magnesium oxide (ZMO), zinc-tin oxide (ZTO), zinc-zirconium oxide (ZnZrO), indium-gallium-zinc oxide (IGZO), indium-zinc-tin oxide (IZTO), indium-gallium-hafnium oxide (IGHO), tin-aluminum-zinc oxide (TAZO), indium-gallium-tin oxide (IGTO), and/or the like. In other words, when the first semiconductor element 250 including a metal oxide semiconductor layer functions as a driving transistor in the large display device, driving characteristics of the first semiconductor element 250 may be maintained by placing the shielding metal layer 120 under the first semiconductor element 250. The first active layer 130 may include a source region, a drain region, and a channel region located between the source region and the drain region.

The second active layer 135 may be disposed in a second part of the display area 10 on the buffer layer 115. In other words, the second active layer 135 may be spaced from (e.g., spaced apart from) the first active layer 130 in the second direction D2. For example, the second active layer 135 may include a metal oxide semiconductor, amorphous silicon, polysilicon, an organic semiconductor, and/or the like. When the display device 100 is a large display device, the second active layer 135 may be a metal oxide semiconductor layer. The second active layer 135 may include a source region, a drain region, and a channel region located between the source region and the drain region.

The first gate insulating pattern 150 may be disposed in the channel region of the first active layer 130. In embodiments, the first gate insulating pattern 150 may be disposed only in (within) the channel region. In other embodiments, the first gate insulating pattern 150 may be disposed over more of the buffer layer 115 (e.g., the whole buffer layer 115). In this case, the second gate insulating pattern 155 may not be provided. For example, the first gate insulating pattern 150 may cover (e.g., sufficiently cover) the first active layer 130 and the second active layer 135 on the buffer layer 115, and may have a flat or substantially flat top surface without creating a step around the first and second active layers 130 and 135. Alternatively, the first gate insulating pattern 150 may be disposed along a profile of the first and second active layers 130 and 135 with a uniform or substantially uniform thickness to cover the first and second active layers 130 and 135 on the buffer layer 115. The first gate insulating pattern 150 may include a silicon compound, metal oxide, and/or the like. For example, the first gate insulating pattern 150 may include silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), and/or the like. In some embodiments, the first gate insulating pattern 150 may have a multilayer structure including a plurality of insulating layers formed of different materials from each other.

The second gate insulating pattern 155 may be disposed in the channel region of the second active layer 135. In embodiments, the second gate insulating pattern 155 may be disposed only in the channel region. The second gate insulating pattern 155 may include a silicon compound, metal oxide, and/or the like. In some embodiments, the second gate insulating pattern 155 may have a multilayer structure including a plurality of insulating layers formed of different materials from each other.

The first gate electrode 170 may be disposed on the first gate insulating pattern 150. In other words, the first gate electrode 170 may overlap the channel region of the first active layer 130. The first gate electrode 170 may include a metal, a metal alloy, metal nitride, conductive metal oxide, a transparent conductive material, and/or the like. In some embodiments, the first gate electrode 170 may have a multilayer structure including a plurality of metal layers.

The second gate electrode 175 may be disposed on the second gate insulating pattern 155. In other words, the second gate electrode 175 may overlap the channel region of the second active layer 135. The second gate electrode 175 may include a metal, a metal alloy, metal nitride, conductive metal oxide, a transparent conductive material, and/or the like. In some embodiments, the second gate electrode 175 may have a multilayer structure including a plurality of metal layers.

The interlayer insulating layer 190 may be disposed in the display area 10 and the pad area 20 on the buffer layer 115, the first and second active layers 130 and 135, the first and second gate insulating patterns 150 and 155, and the first and second gate electrodes 170 and 175. For example, the interlayer insulating layer 190 may be disposed over the whole buffer layer 115. In embodiments, the interlayer insulating layer 190 may cover (e.g., sufficiently cover) the first and second active layers 130 and 135, the first and second gate insulating patterns 150 and 155, and the first and second gate electrodes 170 and 175 on the buffer layer 115, and may have a flat or substantially flat top surface without creating a step around the first and second active layers 130 and 135, the first and second gate insulating patterns 150 and 155, and the first and second gate electrodes 170 and 175. Alternatively, the interlayer insulating layer 190 may be disposed along a profile of the first and second active layers 130 and 135, the first and second gate insulating patterns 150 and 155, and the first and second gate electrodes 170 and 175 with a uniform or substantially uniform thickness to cover the first and second active layers 130 and 135, the first and second gate insulating patterns 150 and 155, and the first and second gate electrodes 170 and 175 on the buffer layer 115. The interlayer insulating layer 190 may include a silicon compound, metal oxide, and/or the like. In some embodiments, the interlayer insulating layer 190 may have a multilayer structure including a plurality of insulating layers formed of different materials from each other.

The first source electrode 210 and the first drain electrode 230 may be disposed in the first part of the display area 10 on the interlayer insulating layer 190. The first source electrode 210 may be connected to the source region of the first active layer 130 through a first through hole 211 formed by removing a first portion of the interlayer insulating layer 190. In addition, the first drain electrode 230 may be connected to the drain region of the first active layer 130 through a second through hole 231 formed by removing a second portion of the interlayer insulating layer 190. Each of the first source electrode 210 and the first drain electrode 230 may include a metal, an alloy, metal nitride, conductive metal oxide, a transparent conductive material, and/or the like. These materials may be used alone or in combination with each other. In embodiments, each of the first source electrode 210 and the first drain electrode 230 may have a multilayer structure including a plurality of metal layers. For example, each of the first source electrode 210 and the first drain electrode 230 may have the same stacked structure as the pad electrode 470.

Accordingly, the first semiconductor element 250 (including the first active layer 130, the first gate electrode 170, the first source electrode 210, and the first drain electrode 230, and disposed between the substrate 110 and the lower electrode 290) may be provided. In this case, the first semiconductor element 250 may function as a driving transistor.

The second source electrode 215 and the second drain electrode 235 may be disposed in the second part of the display area 10 on the interlayer insulating layer 190. The second source electrode 215 may be connected to the source region of the second active layer 135 through a third through hole 216 formed by removing a third portion of the interlayer insulating layer 190. In addition, the second drain electrode 235 may be connected to the drain region of the second active layer 135 through a fourth through hole 236 formed by removing a fourth portion of the interlayer insulating layer 190. Each of the second source electrode 215 and the second drain electrode 235 may include a metal, an alloy, metal nitride, conductive metal oxide, a transparent conductive material, and/or the like. These materials may be used alone or in combination with each other. In embodiments, each of the second source electrode 215 and the second drain electrode 235 may have a multilayer structure including a plurality of metal layers. For example, each of the second source electrode 215 and the second drain electrode 235 may have the same stacked structure as the pad electrode 470.

Accordingly, the second semiconductor element 255 (including the second active layer 135, the second gate electrode 175, the second source electrode 215, and the second drain electrode 235, and disposed between the substrate 110 and the lower electrode 290) may be provided. In this case, the second semiconductor element 255 may function as a switching transistor.

However, although the display device 100 has been described as having a configuration including two transistors (e.g., the first semiconductor element 250 and the second semiconductor element 255), the configuration of the present disclosure is not limited thereto. For example, the display device 100 may have a configuration including at least two transistors and at least one capacitor.

In addition, although each of the first and second semiconductor elements 250 and 255 has been described as having a top gate structure, the configuration of the present disclosure is not limited thereto. For example, each of the first and second semiconductor elements 250 and 255 may have a bottom gate structure, or the first semiconductor element 250 or the second semiconductor element 255 individually may have a bottom gate structure.

The pad electrode 470 may be disposed in the pad area 20 on the interlayer insulating layer 190. As shown in FIG. 3, the pad electrode 470 may have a multilayer structure including a plurality of metal layers. For example, the first metal layer 471 may be disposed on a top surface of the interlayer insulating layer 190, and the second metal layer 472 may be disposed on the first metal layer 471. The third metal layer 473 may be disposed on the second metal layer 472. In addition, the fifth etching rate of the second metal layer 472 may be higher than the fourth etching rate of the first metal layer 471. For example, the second metal layer 472 may be etched relatively more than the first metal layer 471 in the same etching process (e.g., based on an etchant including a phosphoric-acetic acid). Further, the sixth etching rate of the third metal layer 473 may be higher than the fourth etching rate of the first metal layer 471. For example, the third metal layer 473 may be etched relatively more than the first metal layer 471 in the same etching process (e.g., based on an etchant including a phosphoric-acetic acid).

The pad electrode 470 may include a metal, a metal alloy, metal nitride, conductive metal oxide, a transparent conductive material, and/or the like. For example, the pad electrode 470 may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Ir), an aluminum-containing alloy, aluminum nitride ($AlN_x$), a silver-containing alloy, tungsten nitride ($WN_x$), a copper-containing alloy, a molybdenum-containing alloy, titanium nitride ($TiN_x$), chromium nitride ($CrN_x$), tantalum nitride ($TaN_x$), strontium ruthenium oxide ($SrRu_xO_y$), zinc oxide ($ZnO_x$), indium tin oxide (ITO), tin oxide ($SnO_x$), indium oxide ($InO_x$), gallium oxide ($GaO_x$), indium zinc oxide (IZO), and/or the like. These materials may be used alone or in combination with each other. In embodiments, the first metal layer 471 may include Ti (e.g., may be Ti), the second metal layer 472 may include Cu (e.g., may be Cu), and the third metal layer 473 may include ITO (e.g., may be ITO).

Accordingly, the pad electrode 470 including the first metal layer 471, the second metal layer 472, and the third metal layer 473 may be provided.

Referring again to FIG. 2, the protective insulating layer 180 may be disposed in the display area 10 and the pad area 20 on the interlayer insulating layer 190, the first source electrode 210, the first drain electrode 230, the second source electrode 215, the second drain electrode 235, and the pad electrode 470. For example, the protective insulating layer 180 may be disposed in the display area 10 and the pad area 20 between (e.g., between in the third direction D3 or the thickness direction of the substrate 110) the substrate 110 and the lower electrode 290, and the protective insulating layer 180 may be disposed over the interlayer insulating layer 190 (e.g., the whole interlayer insulating layer 190). In embodiments, the protective insulating layer 180 may include a first contact hole 185 that exposes a part of a top surface of the first drain electrode 230, and a second contact hole 187 that exposes a part of a top surface of the pad electrode 470. The lower electrode 290 may make contact with the first drain electrode 230 through the first contact hole 185, and the external device 101 may be connected (e.g., electrically connected) to the pad electrode 470 through the second contact hole 187.

For example, the protective insulating layer 180 may cover (e.g., sufficiently cover) the first source electrode 210, the first drain electrode 230, the second source electrode 215, the second drain electrode 235, and the pad electrode 470 in the display area 10 and the pad area 20 on the interlayer insulating layer 190 except for the portions where the first and second contact holes 185 and 187 are located, and may have a flat or substantially flat top surface without creating a step around the first source electrode 210, the first drain electrode 230, the second source electrode 215, the second drain electrode 235, and the pad electrode 470. Alternatively, the protective insulating layer 180 may be disposed along a profile of the first source electrode 210, the first drain electrode 230, the second source electrode 215, the second drain electrode 235, and the pad electrode 470 with a uniform or substantially uniform thickness to cover the first source electrode 210, the first drain electrode 230, the second source electrode 215, the second drain electrode 235, and the pad electrode 470 in the display area 10 and the pad area 20 on the interlayer insulating layer 190 except for the portions where the first and second contact holes 185 and 187 are located. The protective insulating layer 180 may include a silicon compound, metal oxide, and/or the like. In some embodiments, the protective insulating layer 180 may have a multilayer structure including a plurality of insulating layers including different materials from each other.

The planarization layer 270 may be disposed in the display area 10 on the protective insulating layer 180. In other words, the planarization layer 270 may be disposed between the substrate 110 and the lower electrode 290. In embodiments, the planarization layer 270 may include a third contact hole 275 that exposes a part of the protective insulating layer 180 adjacent to the portion where the first contact hole 185 is formed and the part of the top surface of the first drain electrode 230. The lower electrode 290 may make contact with the first drain electrode 230 through the third contact hole 275 and the first contact hole 185. In addition, the planarization layer 270 may have a protrusion 277 protruding in the third direction D3. The protrusion 277 may correspond to a portion making contact with a bottom surface of the lower electrode 290. For example, the planarization layer 270 may have a relatively thick thickness to cover (e.g., sufficiently cover) the protective insulating layer 180 in the display area 10. In this case, the planarization layer 270 may have a flat or substantially flat top surface except for the protrusion 277. In order to implement such a flat top surface of the planarization layer 270, a planarization process may be additionally performed on the planarization layer 270. The planarization layer 270 may include an organic material, an inorganic material, and/or the like. In embodiments, the planarization layer 270 may include an organic material such as a photoresist, a polyacryl-based resin, a polyimide-based resin, a polyamide-based resin, a siloxane-based resin, an acryl-based resin, and/or an epoxy-based resin.

The lower electrode 290 may be disposed in the display area 10 on the planarization layer 270. In other words, the lower electrode 290 may be disposed on the protrusion 277 of the planarization layer 270. Because the lower electrode 290 makes contact with the first drain electrode 230 through the third contact hole 275 and the first contact hole 185, the lower electrode 290 may be connected (e.g., electrically connected) to the first semiconductor element 250.

As shown in FIG. 2, the lower electrode 290 may have a multilayer structure including a plurality of metal layers. For example, the first electrode 291 may be disposed on a top surface of the planarization layer 270, and the second electrode 292 may be disposed on the first electrode 291. The third electrode 293 may be disposed on the second electrode 292. In addition, the second etching rate of the second electrode 292 may be higher than the first etching rate of the first electrode 291. For example, the second electrode 292 may be etched relatively more than the first electrode 291 in the same etching process (e.g., based on an etchant including a phosphoric-acetic acid). Further, the second etching rate of the second electrode 292 may be higher than the third etching rate of the third electrode 293. For example, the second electrode 292 may be etched relatively more than the third electrode 293 in the same etching process (e.g., based on an etchant including a phosphoric-acetic acid). Moreover, the third etching rate of the third electrode 293 may be higher than the first etching rate of the first electrode 291. For example, the third electrode 293 may be etched relatively more than the first electrode 291 in the same etching process (e.g., based on an etchant including a phosphoric-acetic acid). In this case, the first etching rate may be equal or substantially equal to the fourth etching rate, and the third etching rate may be equal or substantially equal to the sixth etching rate. In addition, a thickness of the first electrode 291 may be approximately (about) 50 angstroms to approximately (about) 300 angstroms, a thickness of the second electrode 292 may be approximately 100 angstroms to approximately 2000 angstroms, and a thickness of the third electrode 293 may be approximately 10 angstroms to approximately 500 angstroms.

The first electrode 291 may cover an uneven top surface of the planarization layer 270. Because the first electrode 291 is disposed on the planarization layer 270, the first electrode 291 may assist in forming the second electrode 292. Because the third electrode 293 is disposed on the second electrode 292, color coordinates of the display device 100 may be adjusted (e.g., easily adjusted). The second electrode 292 may function as a light reflection layer. The second electrode 292 may reflect light emitted from the light emitting layer 330 toward a front surface of the display device 100 (e.g., in the third direction D3). Therefore, the lower electrode 290 including the second electrode 292 may be opaque or substantially opaque. In some embodiments, the lower electrode 290 may have a multilayer structure including the first electrode 291 and the second electrode 292.

The lower electrode 290 may include a metal, a metal alloy, metal nitride, conductive metal oxide, a transparent conductive material, and/or the like. For example, the lower electrode 290 may include Au, Ag, Al, Pt, Ni, Ti, Pd, Mg, Ca, Li, Cr, Ta, W, Cu, Mo, Sc, Nd, Ir, an aluminum-containing alloy, $AlN_x$, a silver-containing alloy, $WN_x$, a copper-containing alloy, a molybdenum-containing alloy, $TiN_x$, $CrN_x$, $TaN_x$, $SrRu_xO_y$, $ZnO_x$, ITO, $SnO_x$, $InO_x$, $GaO_x$, IZO, and/or the like. These materials may be used alone or in combination with each other. In embodiments, the first electrode 291 may include (e.g., may be Ti), the second electrode 292 may include Ag (e.g., may be Ag), and the third electrode 293 may include ITO (e.g., may be ITO).

The pixel defining layer 310 may be disposed on a part of the lower electrode 290 in the display area 10. In other words, the pixel defining layer 310 may cover both side portions of the lower electrode 290, and may expose a part of a top surface of the lower electrode 290. The pixel defining layer 310 may include an organic material and/or an inorganic material. In embodiments, the pixel defining layer 310 may include an organic material (e.g., may be an organic layer).

The light emitting layer 330 may be disposed on the lower electrode 290 exposed by the pixel defining layer 310. The light emitting layer 330 may be formed by using at least one of light emitting materials for emitting different color lights (e.g., red light, green light, blue light, etc.) according to sub-pixels. Alternatively, the light emitting layer 330 may be formed by stacking a plurality of light emitting materials for generating different color lights such as red light, green light, and blue light to emit white light as a whole. In this case, a color filter may be disposed on the light emitting layer 330 (e.g., disposed on a top surface of a thin film encapsulation structure disposed on the upper electrode 340 to overlap the light emitting layer 330). The color filter may include at least one of a red color filter, a green color filter, or a blue color filter. In some embodiments, the color filter may include at least one of a yellow color filter, a cyan color filter, or a magenta color filter. The color filter may include a photosensitive resin, a color photoresist, and/or the like. In other embodiments, the light emitting layer 330 may emit blue light. In this case, an optical filter (e.g., a quantum dot layer and a scattering layer) may be disposed on the light emitting layer 330, and the color filter may be disposed on the optical filter.

The upper electrode 340 may be disposed in the display area 10 on the pixel defining layer 310 and the light emitting layer 330. The upper electrode 340 may cover the light emitting layer 330 and the pixel defining layer 310, and may be disposed over the light emitting layer 330 and the pixel defining layer 310 (e.g., the whole of the light emitting layer 330 and the pixel defining layer 310). The upper electrode 340 may include a metal, an alloy, metal nitride, conductive metal oxide, a transparent conductive material, and/or the like. These materials may be used alone or in combination with each other. In some embodiments, the upper electrode 340 may have a multilayer structure including a plurality of metal layers.

Accordingly, the pixel structure 200 including the lower electrode 290 (e.g., the lower electrode 290 including the first electrode 291, the second electrode 292, and the third electrode 293), the light emitting layer 330, and the upper electrode 340 may be provided, and the display device 100 shown in FIGS. 1-3 may be provided.

In a process of manufacturing a conventional display device, a pad electrode may be damaged by an etchant used when etching a lower electrode. For example, a preliminary electrode layer may be formed over the whole of a planarization layer disposed in a display area, a protective insulating layer disposed in a pad area, and the pad electrode. For example, the preliminary electrode layer may be formed over a whole substrate. In this case, the preliminary electrode layer may have a stacked structure in which ITO, Ag, and ITO are stacked. After the preliminary electrode layer is formed, a photoresist pattern may be formed on one portion of the preliminary electrode layer, and the remaining portion of the preliminary electrode layer on which the photoresist pattern is not formed (e.g., the remaining portion of the preliminary electrode layer not covered by the photoresist pattern) may be removed through a wet etching process. In other words, the preliminary electrode layer in which ITO, Ag, and ITO are stacked may be etched through a single wet etching process. In this case, the pad electrode may have a stacked structure in which Ti, Cu, and ITO are stacked. In the wet etching process, the etchant may make contact with the pad electrode through a second contact hole, and ITO, which is an uppermost layer of the pad electrode, may be etched, so that Cu, which is an intermediate layer, may be etched. Alternatively, the etchant may permeate through a fine gap between the protective insulating layer and the pad electrode at a portion where the protective insulating layer and the pad electrode make contact with each other. When the etchant permeates through the fine gap, the etchant may etch Cu having a relatively high etching rate. In other words, the pad electrode may also be etched in the etching process for forming the lower electrode, so that a contact failure in which the pad electrode of the conventional display device is not electrically connected to the external device 101 may occur.

Because the display device 100 according to embodiments of the present disclosure includes the lower electrode 290 having the stacked structure in which Ti, Ag, and ITO are stacked, an etchant used in the etching process for forming the lower electrode 290 may not make contact with the pad electrode 470, and the pad electrode 470 may not be etched by the etchant. Accordingly, a contact failure in which the pad electrode 470 of the display device 100 is not electrically connected to the external device 101 may not occur.

Although the display device 100 according to the present disclosure has been described as specifically being an organic light emitting diode display device, the configuration of the present disclosure is not limited thereto. In other embodiments, the display device 100 may include a liquid crystal display device (LCD), a field emission display device (FED), a plasma display device (PDP), or an electrophoretic display device (EPD).

FIGS. 4-18 are cross-sectional views showing a method of manufacturing a display device according to embodiments of the present disclosure.

Figure 4:
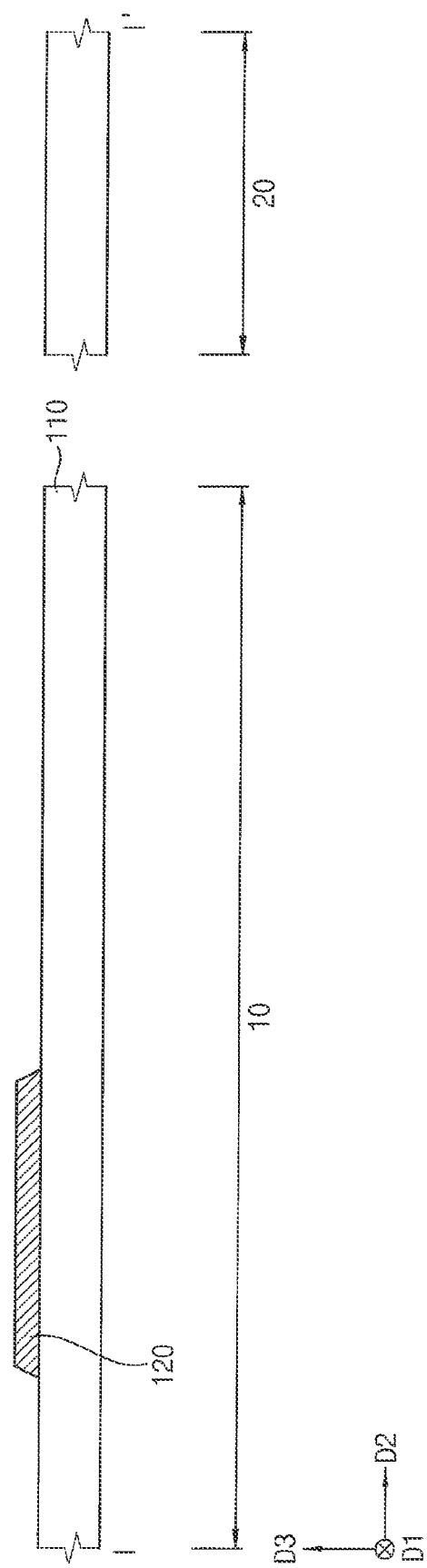

Referring to FIG. 4, a substrate 110 including a transparent and/or opaque material may be provided. The substrate 110 may be formed by using a quartz substrate, a synthetic quartz substrate, a calcium fluoride substrate, a fluorine-doped quartz substrate, a soda lime glass substrate, a non-alkali glass substrate, and/or the like. The substrate 110 may be divided into a display area 10 and a pad area 20.

In other embodiments, the substrate 110 may be a transparent resin substrate having flexibility. Non-limiting examples of the transparent resin substrate that may be used as the substrate 110 include a polyimide substrate. In this case, the polyimide substrate may have a stacked structure including a first polyimide layer, a barrier film layer, and a second polyimide layer.

The shielding metal layer 120 may be formed in the display area 10 on the substrate 110. The shielding metal layer 120 may be formed by using a metal, a metal alloy, metal nitride, conductive metal oxide, a transparent conductive material, and/or the like. These materials may be used alone or in combination with each other. In some embodiments, the shielding metal layer 120 may have a multilayer structure including a plurality of metal layers. In some embodiments, the shielding metal layer 120 may further include a light blocking material to block or substantially block external light. The light blocking material may be formed by using carbon black, titanium nitride oxide, titanium black, phenylene black, aniline black, cyanine black, nigrosine acid black, a black resin, and/or the like.

Figure 5:
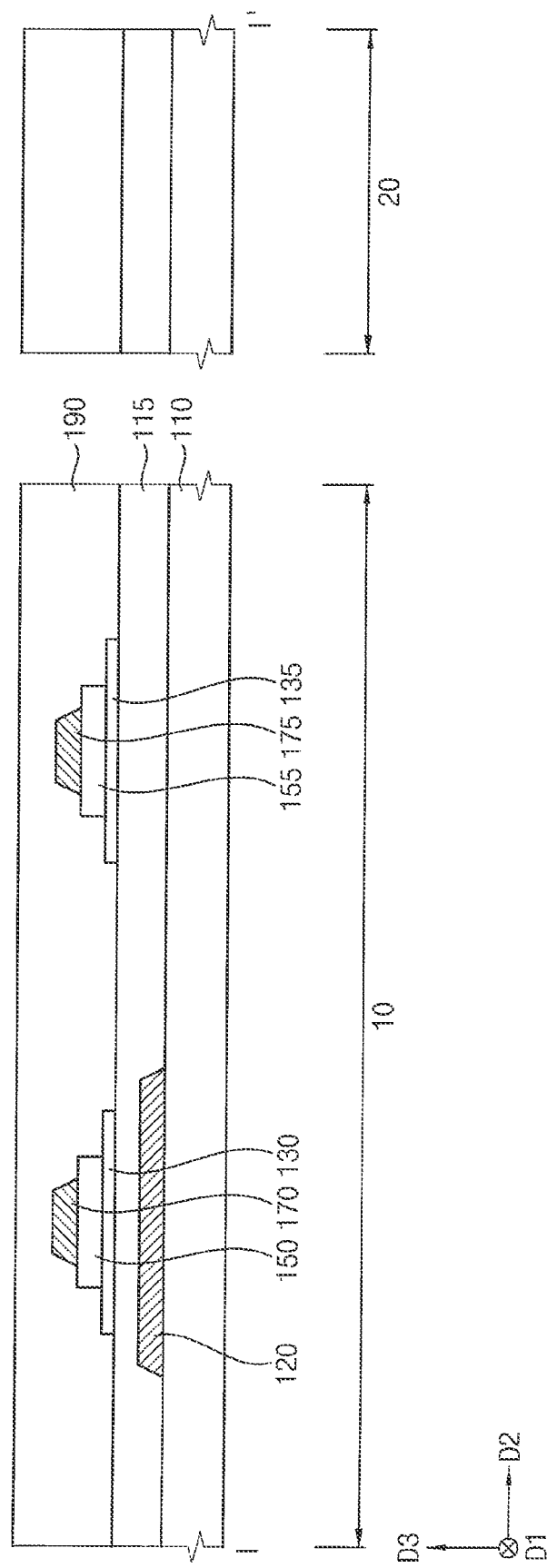

Referring to FIG. 5, the buffer layer 115 may be formed in the display area 10 and the pad area 20 on the substrate 110 and the shielding metal layer 120. In other words, the buffer layer 115 may be formed over the substrate 110 (e.g., the whole substrate 110). For example, the buffer layer 115 may cover (e.g., sufficiently cover) the shielding metal layer 120 on the substrate 110, and may have a flat or substantially flat top surface without creating a step around the shielding metal layer 120. Alternatively, the buffer layer 115 may be formed along a profile of the shielding metal layer 120 with a uniform or substantially uniform thickness to cover the shielding metal layer 120 on the substrate 110. The buffer layer 115 may prevent or substantially prevent metal atoms or impurities from diffusing from the substrate 110. In addition, when a surface of the substrate 110 is not uniform, the buffer layer 115 may serve to improve flatness of the surface of the substrate 110. Depending on a type of the substrate 110, at least two buffer layers 115 may be provided on the substrate 110, or the buffer layer 115 may not be formed. For example, in the case where the buffer layer 115 is provided, the buffer layer 115 may include an organic material and/or an inorganic material. In embodiments, the buffer layer 115 may be formed by using an inorganic material (e.g., may be an inorganic layer).

The first active layer 130 may be formed in a first part of the display area 10 on the buffer layer 115. In other words, the first active layer 130 may be formed on a part of the buffer layer 115 under which the shielding metal layer 120 is located. For example, the first active layer 130 may include a metal oxide semiconductor, amorphous silicon, poly silicon, an organic semiconductor, and/or the like. In embodiments, the first active layer 130 may be a metal oxide semiconductor layer including a binary compound, a ternary compound, and/or the like that contain In, Zn, Ga, Sn, Ti, Al, Hf, Zr, Mg, and/or the like. For example, the first active layer 130 may include $ZnO_x$, $GaO_x$, $TiO_x$, $SnO_x$, $InO_x$, IGO, IZO, ITO, GZO, ZMO, ZTO, ZnZrO, IGZO, IZTO, IGHO, TAZO, IGTO, and/or the like. The first active layer 130 may include a source region, a drain region, and a channel region located between the source region and the drain region.

The second active layer 135 may be formed in a second part of the display area 10 on the buffer layer 115. In other words, the second active layer 135 may be spaced from (e.g., spaced apart from) the first active layer 130 in the second direction D2. For example, the second active layer 135 may by formed by using a metal oxide semiconductor, amorphous silicon, polysilicon, an organic semiconductor, and/or the like. In embodiments, the second active layer 135 may be a metal oxide semiconductor layer. The second active layer 135 may include a source region, a drain region, and a channel region located between the source region and the drain region.

For example, the first and second active layers 130 and 135 may be concurrently (e.g., simultaneously) formed by forming a preliminary active layer over the buffer layer 115 (e.g., the whole buffer layer 115) and partially etching the preliminary active layer. In other words, the first and second active layers 130 and 135 may be formed on or at the same layer by using the same material.

The first gate insulating pattern 150 may be formed in the channel region of the first active layer 130. In embodiments, the first gate insulating pattern 150 may be formed only in the channel region. The first gate insulating pattern 150 may be formed by using a silicon compound, metal oxide, and/or the like. For example, the first gate insulating pattern 150 may include $SiO_x$, $SiN_x$, $SiO_xN_y$, $SiO_xC_y$, $SiC_xN_y$, $AlO_x$, $AlN_x$, $TaO_x$, $HfO_x$, $ZrO_x$, $TiO_x$, and/or the like. In some embodiments, the first gate insulating pattern 150 may have a multilayer structure including a plurality of insulating layers formed of different materials from each other.

The second gate insulating pattern 155 may be formed in the channel region of the second active layer 135. In embodiments, the second gate insulating pattern 155 may be formed only in the channel region. The second gate insulating pattern 155 may be formed by using a silicon compound, metal oxide, and/or the like. In some embodiments, the second gate insulating pattern 155 may have a multilayer structure including a plurality of insulating layers formed of different materials from each other.

For example, the first and second gate insulating patterns 150 and 155 may be concurrently (e.g., simultaneously) formed by forming a preliminary insulating layer over the buffer layer 115 (e.g., the whole the buffer layer 115) and the first and second active layers 130 and 135 and partially etching the preliminary insulating layer. In other words, the first and second gate insulating patterns 150 and 155 may be formed on or at the same layer by using the same material.

The first gate electrode 170 may be formed on the first gate insulating pattern 150. In other words, the first gate electrode 170 may overlap the channel region of the first active layer 130.

The second gate electrode 175 may be formed on the second gate insulating pattern 155. In other words, the second gate electrode 175 may overlap the channel region of the second active layer 135.

Each of the first and second gate electrodes 170 and 175 may be formed by using a metal, a metal alloy, metal nitride, conductive metal oxide, a transparent conductive material, and/or the like. In some embodiments, each of the first and second gate electrodes 170 and 175 may have a multilayer structure including a plurality of metal layers.

For example, the first and second gate electrodes 170 and 175 may be concurrently (e.g., simultaneously) formed by forming a first preliminary electrode layer over the buffer layer 115 (e.g., the whole buffer layer 115) and partially etching the first preliminary electrode layer. In other words, the first and second gate electrodes 170 and 175 may be formed on or at the same layer by using the same material.

The interlayer insulating layer 190 may be formed in the display area 10 and the pad area 20 on the buffer layer 115, the first and second active layers 130 and 135, the first and second gate insulating patterns 150 and 155, and the first and second gate electrodes 170 and 175. For example, the interlayer insulating layer 190 may be formed over the whole buffer layer 115. In embodiments, the interlayer insulating layer 190 may cover (e.g., sufficiently cover) the first and second active layers 130 and 135, the first and second gate insulating patterns 150 and 155, and the first and second gate electrodes 170 and 175 on the buffer layer 115, and may have a flat or substantially flat top surface without creating a step around the first and second active layers 130 and 135, the first and second gate insulating patterns 150 and 155, and the first and second gate electrodes 170 and 175. Alternatively, the interlayer insulating layer 190 may be formed along a profile of the first and second active layers 130 and 135, the first and second gate insulating patterns 150 and 155, and the first and second gate electrodes 170 and 175 with a uniform or substantially uniform thickness to cover the first and second active layers 130 and 135, the first and second gate insulating patterns 150 and 155, and the first and second gate electrodes 170 and 175 on the buffer layer 115. The interlayer insulating layer 190 may be formed by using a silicon compound, metal oxide, and/or the like. In some embodiments, the interlayer insulating layer 190 may have a multilayer structure including a plurality of insulating layers formed of different materials from each other.

Figure 6:
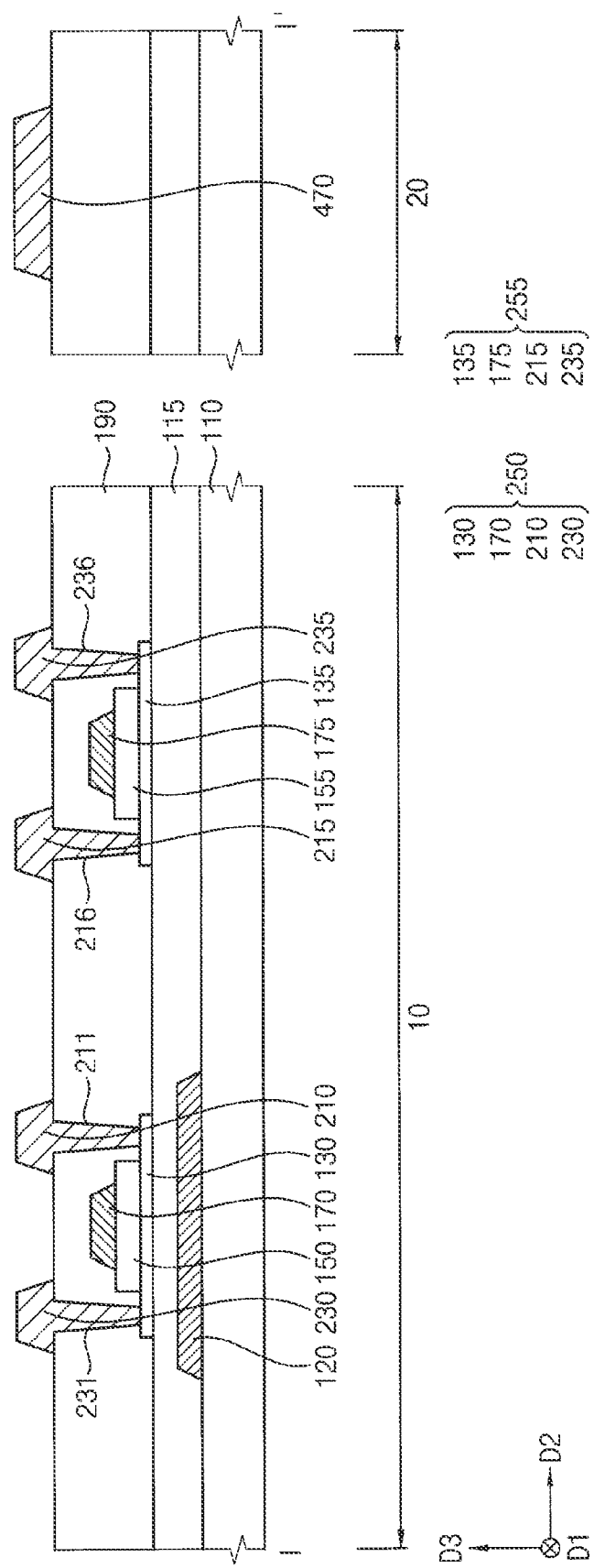

Referring to FIG. 6, a first through hole 211, a second through hole 231, a third through hole 216, and a fourth through hole 236 may be formed by removing a first portion, a second portion, a third portion, and a fourth portion of the interlayer insulating layer 190, respectively. The first source electrode 210 may be connected to the source region of the first active layer 130 through the first through hole 211, and the first drain electrode 230 may be connected to the drain region of the first active layer 130 through the second through hole 231.

Accordingly, the first semiconductor element 250 including the first active layer 130, the first gate electrode 170, the first source electrode 210, and the first drain electrode 230 may be formed. In this case, the first semiconductor element 250 may function as a driving transistor.

The second source electrode 215 may be connected to the source region of the second active layer 135 through the third through hole 216 of the interlayer insulating layer 190, and the second drain electrode 235 may be connected to the drain region of the second active layer 135 through the fourth through hole 236.

Accordingly, the second semiconductor element 255 (including the second active layer 135, the second gate electrode 175, the second source electrode 215, and the second drain electrode 235) may be formed. In this case, the second semiconductor element 255 may function as a switching transistor.

The pad electrode 470 may be formed in the pad area 20 on the interlayer insulating layer 190. Each of the first source electrode 210, the first drain electrode 230, the second source electrode 215, the second drain electrode 235, and the pad electrode 470 may be formed by using a metal, a metal alloy, metal nitride, conductive metal oxide, a transparent conductive material, and/or the like. For example, each of the first source electrode 210, the first drain electrode 230, the second source electrode 215, and the second drain electrode 235 may include Au, Ag, Al, Pt, Ni, Ti, Pd, Mg, Ca, Li, Cr, Ta, W, Cu, Mo, Sc, Nd, Ir, an aluminum-containing alloy, $AlN_x$, a silver-containing alloy, $WN_x$, a copper-containing alloy, a molybdenum-containing alloy, $TiN_x$, $CrN_x$, $TaN_x$, $SrRu_xO_y$, $ZnO_x$, ITO, $SnO_x$, $InO_x$, $GaO_x$, IZO, and/or the like. These materials may be used alone or in combination with each other.

For example, the first source electrode 210, the first drain electrode 230, the second source electrode 215, the second drain electrode 235, and the pad electrode 470 may be concurrently (e.g., simultaneously) formed by forming a second preliminary electrode layer over the interlayer insulating layer 190 (e.g., the whole interlayer insulating layer 190) and partially etching the second preliminary electrode layer. In other words, the first source electrode 210, the first drain electrode 230, the second source electrode 215, the second drain electrode 235, and the pad electrode 470 may be formed on or at the same layer by using the same material.

In embodiments, each of the first source electrode 210, the first drain electrode 230, the second source electrode 215, the second drain electrode 235, and the pad electrode 470 may have a multilayer structure including a plurality of metal layers. For example, as shown in FIG. 3, the pad electrode 470 may include a first metal layer 471, a second metal layer 472, and a third metal layer 473. In this case, the first metal layer 471 may be formed on a top surface of the interlayer insulating layer 190, and the second metal layer 472 may be formed on the first metal layer 471. The third metal layer 473 may be formed on the second metal layer 472. In this case, the first metal layer 471 may include Ti, the second metal layer 472 may include Cu, and the third metal layer 473 may include ITO.

Accordingly, the pad electrode 470 including the first metal layer 471, the second metal layer 472, and the third metal layer 473 may be formed, and each of the first source electrode 210, the first drain electrode 230, the second source electrode 215, and the second drain electrode 235 may have the same stacked structure as the pad electrode 470. In other words, each of the first source electrode 210, the first drain electrode 230, the second source electrode 215, and the second drain electrode 235 may be made of the same material as the pad electrode 470.

Figure 7:
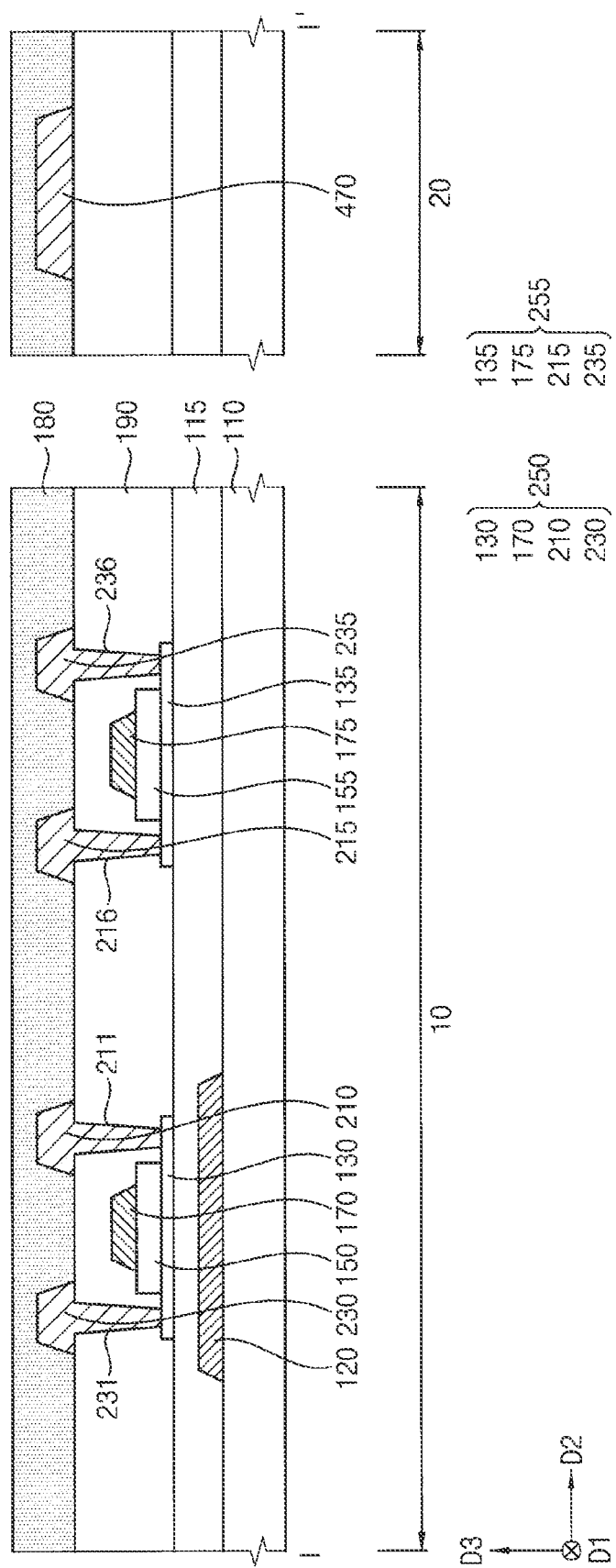

Referring to FIG. 7, the protective insulating layer 180 may be formed in the display area 10 and the pad area 20 on the interlayer insulating layer 190, the first source electrode 210, the first drain electrode 230, the second source electrode 215, the second drain electrode 235, and the pad electrode 470. The protective insulating layer 180 may be disposed over the interlayer insulating layer 190 (e.g., the whole interlayer insulating layer 190). For example, the protective insulating layer 180 may cover (e.g., sufficiently cover) the first source electrode 210, the first drain electrode 230, the second source electrode 215, the second drain electrode 235, and the pad electrode 470 in the display area 10 and the pad area 20 on the interlayer insulating layer 190, and may have a flat or substantially flat top surface without creating a step around the first source electrode 210, the first drain electrode 230, the second source electrode 215, the second drain electrode 235, and the pad electrode 470. Alternatively, the protective insulating layer 180 may be formed along a profile of the first source electrode 210, the first drain electrode 230, the second source electrode 215, the second drain electrode 235, and the pad electrode 470 with a uniform or substantially uniform thickness to cover the first source electrode 210, the first drain electrode 230, the second source electrode 215, the second drain electrode 235, and the pad electrode 470 in the display area 10 and the pad area 20 on the interlayer insulating layer 190 except for the portions where the first and second contact holes 185 and 187 are located. The protective insulating layer 180 may be formed by using a silicon compound, metal oxide, and/or the like. In some embodiments, the protective insulating layer 180 may have a multilayer structure including a plurality of insulating layers including different materials from each other.

Figure 8:
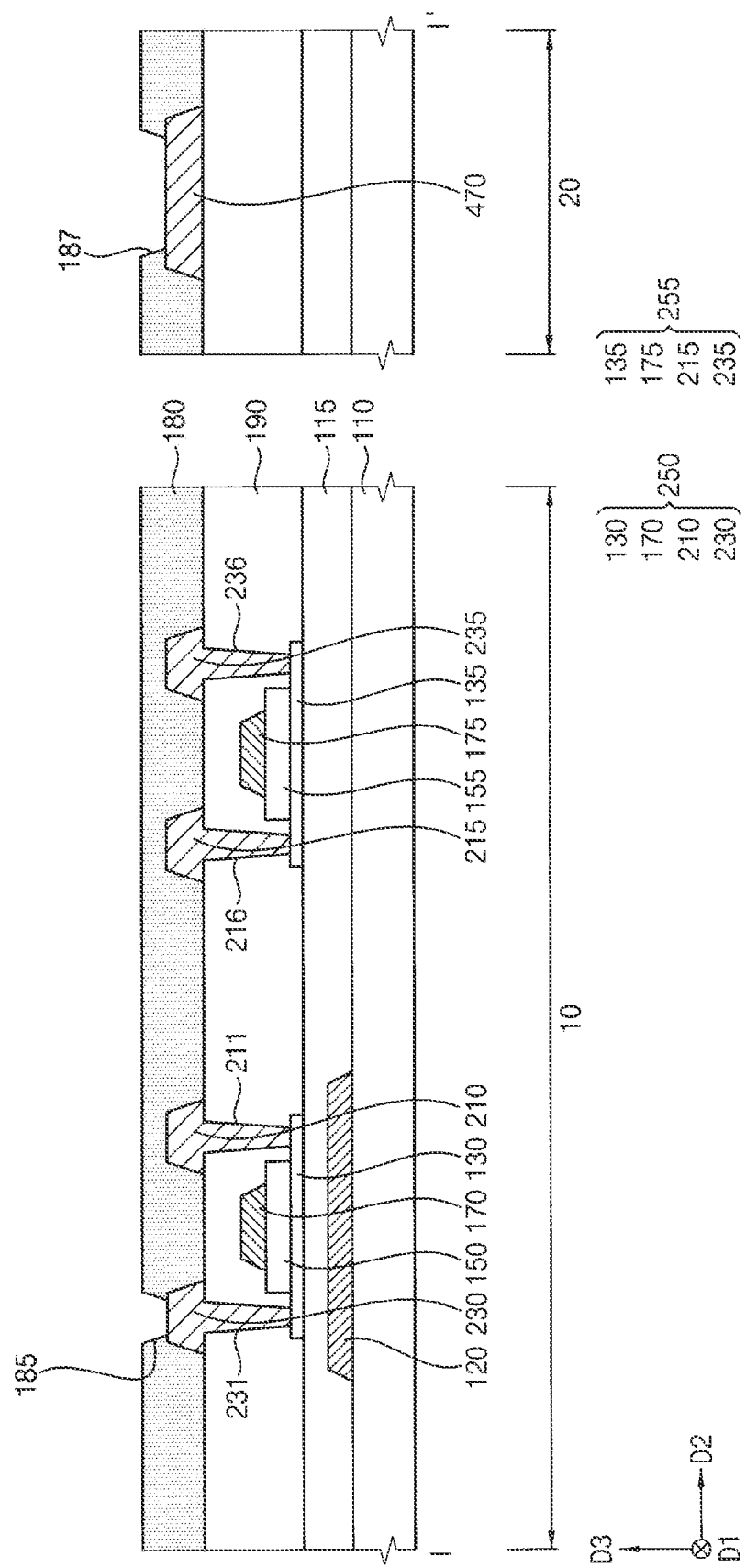

Referring to FIG. 8, a first contact hole 185 that exposes a part of a top surface of the first drain electrode 230 and a second contact hole 187 that exposes a part of a top surface of the pad electrode 470 may be formed in the protective insulating layer 180. The first contact hole 185 may be formed in the display area 10, and the second contact hole 187 may be formed in the pad area 20.

Figure 9:
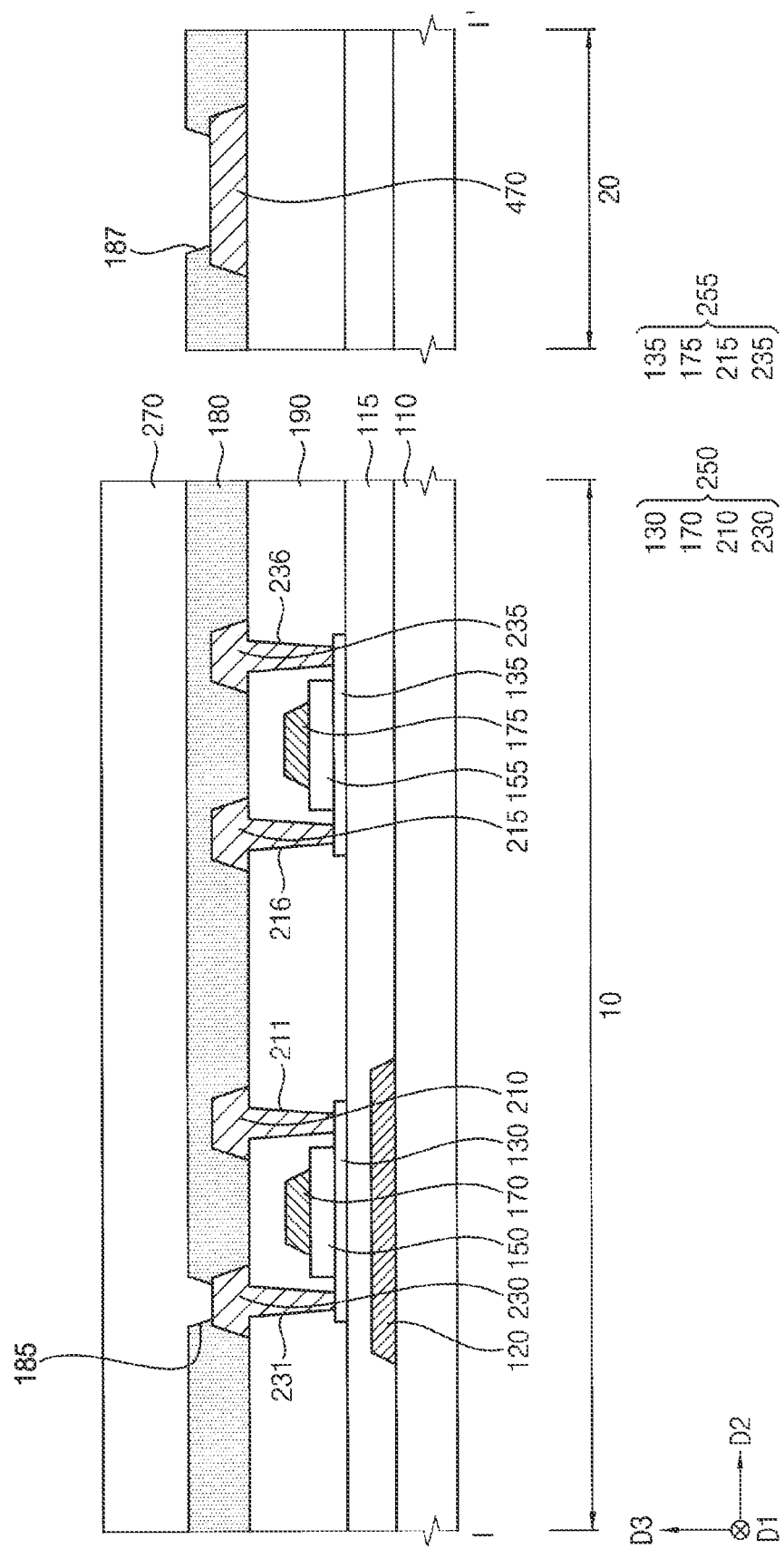

Referring to FIG. 9, the planarization layer 270 may be formed in the display area 10 on the protective insulating layer 180. For example, the planarization layer 270 may have a relatively thick thickness to cover (e.g., sufficiently cover) the protective insulating layer 180 in the display area 10. In this case, the planarization layer 270 may have a flat or substantially flat top surface. In order to implement such a flat or substantially flat top surface of the planarization layer 270, a planarization process may be additionally performed on the planarization layer 270. The planarization layer 270 may include an organic material, an inorganic material, and/or the like. In embodiments, the planarization layer 270 may be formed by using an organic material such as a photoresist, a polyacryl-based resin, a polyimide-based resin, a polyamide-based resin, a siloxane-based resin, an acryl-based resin, and/or an epoxy-based resin.

Figure 10:
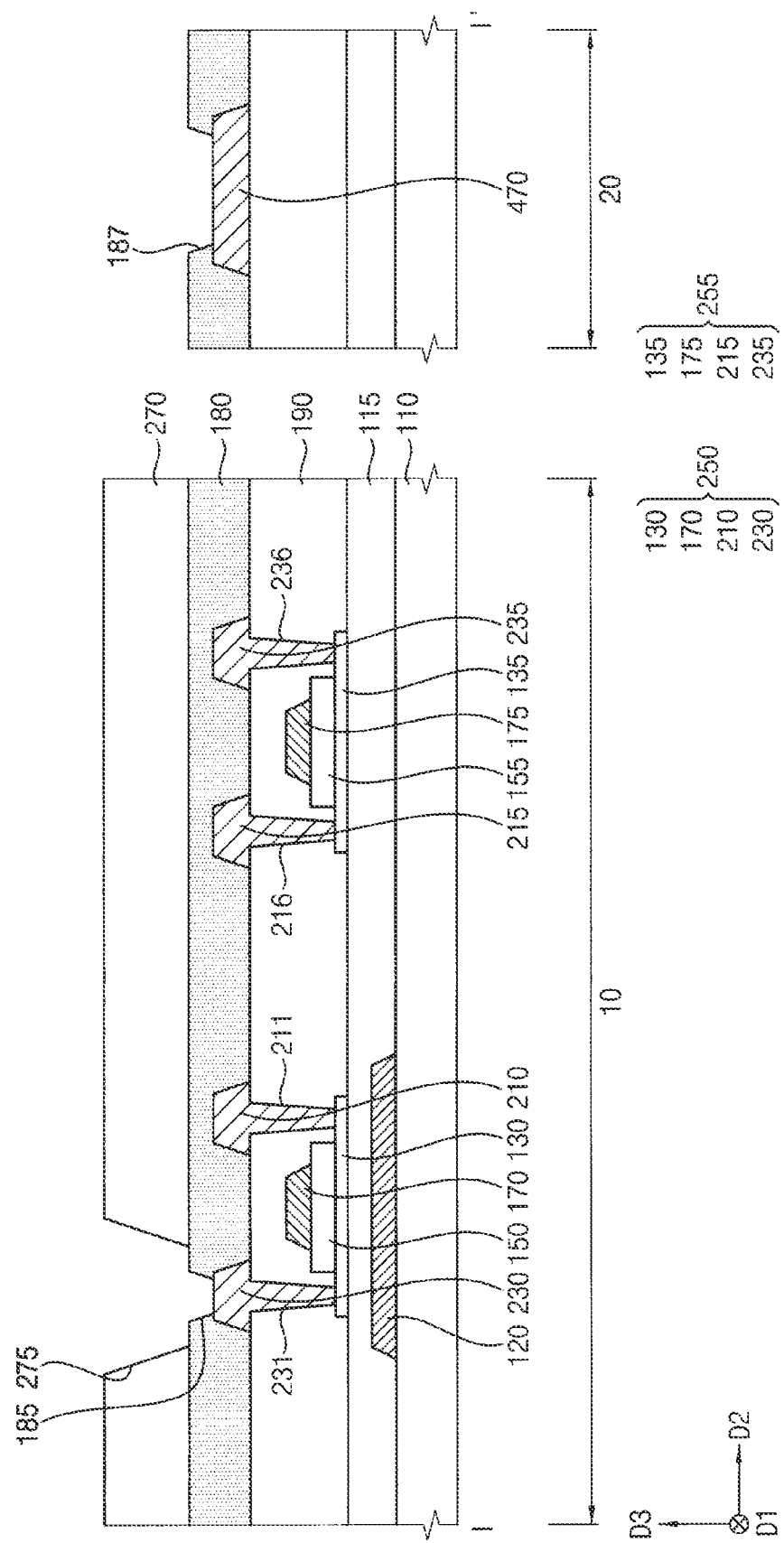

Referring to FIG. 10, a third contact hole 275 may be formed in the planarization layer 270 that exposes a part of the protective insulating layer 180 (e.g., a top surface of the protective insulating layer 180) adjacent to the portion where the first contact hole 185 is formed and the part of the top surface of the first drain electrode 230. In embodiments, the third contact hole 275 may overlap the first contact hole 185 in the third direction D3 or the thickness direction of the substrate 110, and the third contact hole 275 may be larger in size than the first contact hole 185. The third contact hole 275 and the first contact hole 185 may form or constitute a single contact hole that exposes the part of the top surface of the first drain electrode 230.

Figure 11:
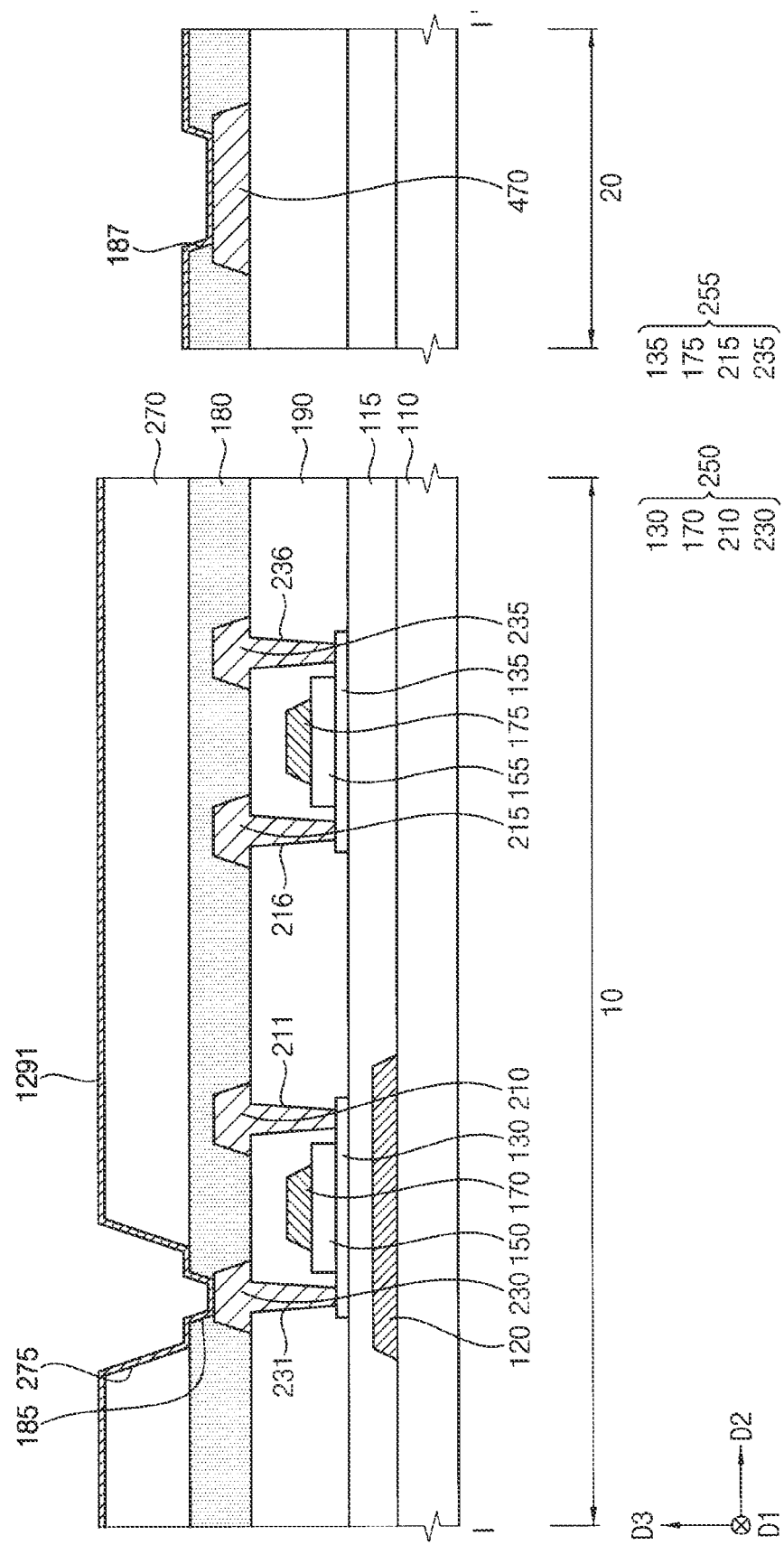

Referring to FIG. 11, a first electrode layer 1291 may be formed over the substrate 110 (e.g., the whole substrate 110). For example, the first electrode layer 1291 may be formed on a top surface of the planarization layer 270, the first contact hole 185, a top surface of the protective insulating layer 180, the third contact hole 275, and the top surface of the pad electrode 470. The first electrode layer 1291 may cover an uneven top surface of the planarization layer 270. A thickness of the first electrode layer 1291 may be approximately 50 angstroms to approximately 300 angstroms. The first electrode layer 1291 may make contact with the first drain electrode 230 through the first contact hole 185 and the third contact hole 275, and may make contact with the pad electrode 470 through the second contact hole 187. The first electrode layer 1291 may include a metal, a metal alloy, metal nitride, conductive metal oxide, a transparent conductive material, and/or the like. In embodiments, the first electrode layer 1291 may be formed by using Ti, and may have a first etching rate.

Figure 12:
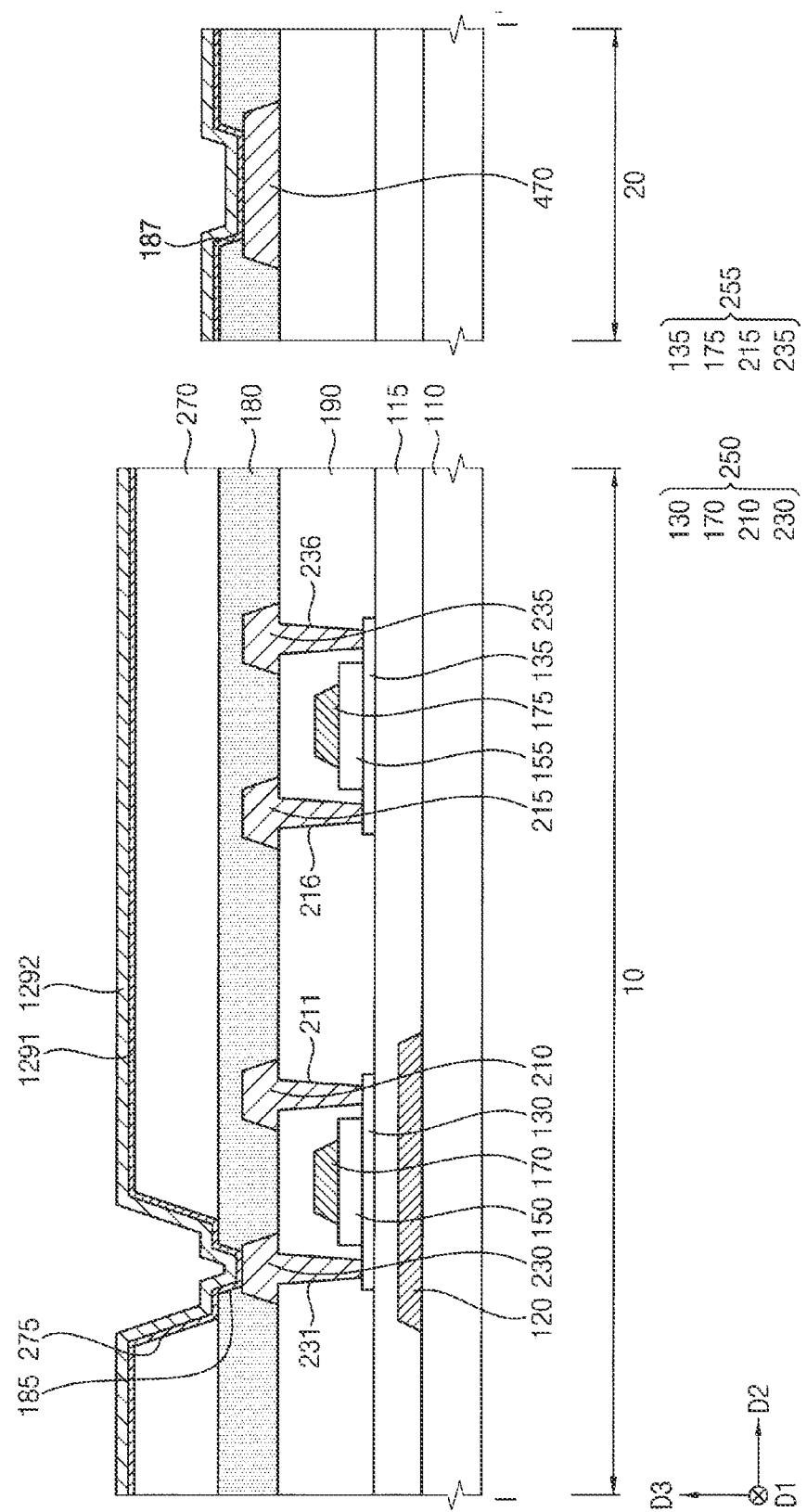

Referring to FIG. 12, a second electrode layer 1292 may be formed on the first electrode layer 1291. For example, because the first electrode layer 1291 is formed on the planarization layer 270, the first electrode layer 1291 may assist in forming the second electrode layer 1292, and the second electrode layer 1292 may be formed over the first electrode layer 1291 (e.g., the whole first electrode layer 1291) along a profile of the first electrode layer 1291. A thickness of the second electrode layer 1292 may be approximately 100 angstroms to approximately 2000 angstroms. The second electrode layer 1292 may include a metal, a metal alloy, metal nitride, conductive metal oxide, a transparent conductive material, and/or the like. In embodiments, the second electrode layer 1292 may be formed by using Ag, and may have a second etching rate that is higher than the first etching rate. For example, the second electrode layer 1292 may be etched relatively more than the first electrode layer 1291 in the same etching process.

Figure 13:
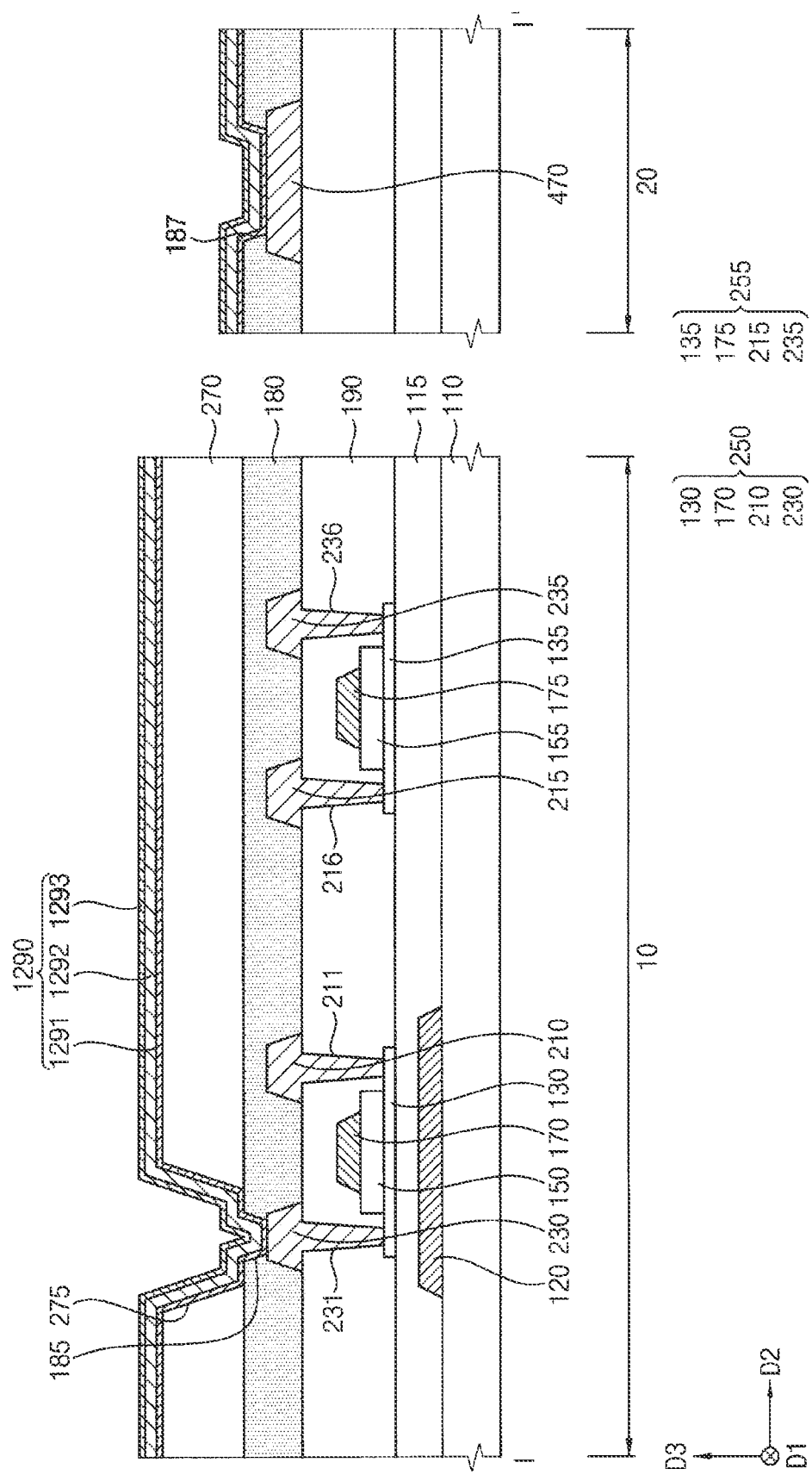

Referring to FIG. 13, a third electrode layer 1293 may be formed on the second electrode layer 1292. For example, the third electrode layer 1293 may be formed over the whole second electrode layer 1292 along a profile of the second electrode layer 1292, and a thickness of the second electrode layer 1292 may be approximately 10 angstroms to approximately 500 angstroms. The third electrode layer 1293 may include a metal, a metal alloy, metal nitride, conductive metal oxide, a transparent conductive material, and/or the like.

In embodiments, the third electrode layer 1293 may be formed by using ITO, and may have a third etching rate that is lower than the second etching rate and higher than the first etching rate. For example, in the same etching process, the second electrode layer 1292 may be etched relatively more than the third electrode layer 1293, and the third electrode layer 1293 may be etched relatively more than the first electrode layer 1291.

Accordingly, a preliminary electrode layer 1290 (including a stack structure in which the first electrode layer 1291, the second electrode layer 1292, and the third electrode layer 1293 are sequentially stacked) may be formed.

In embodiments, with respect to the same etching process, the pad electrode 470 may be configured such that the first metal layer 471 has a fourth etching rate, the second metal layer 472 has a fifth etching rate that is higher than the fourth etching rate, and the third metal layer 473 has a sixth etching rate that is higher than the fourth etching rate. In this case, because the first metal layer 471 is formed by using Ti, the fourth etching rate of the first metal layer 471 may be substantially the same as the first etching rate of the first electrode layer 1291 formed by using Ti. In addition, because the third metal layer 473 is formed by using ITO, the sixth etching rate of the third metal layer 473 may be substantially the same as the third etching rate of the third electrode layer 1293.

Figure 14:
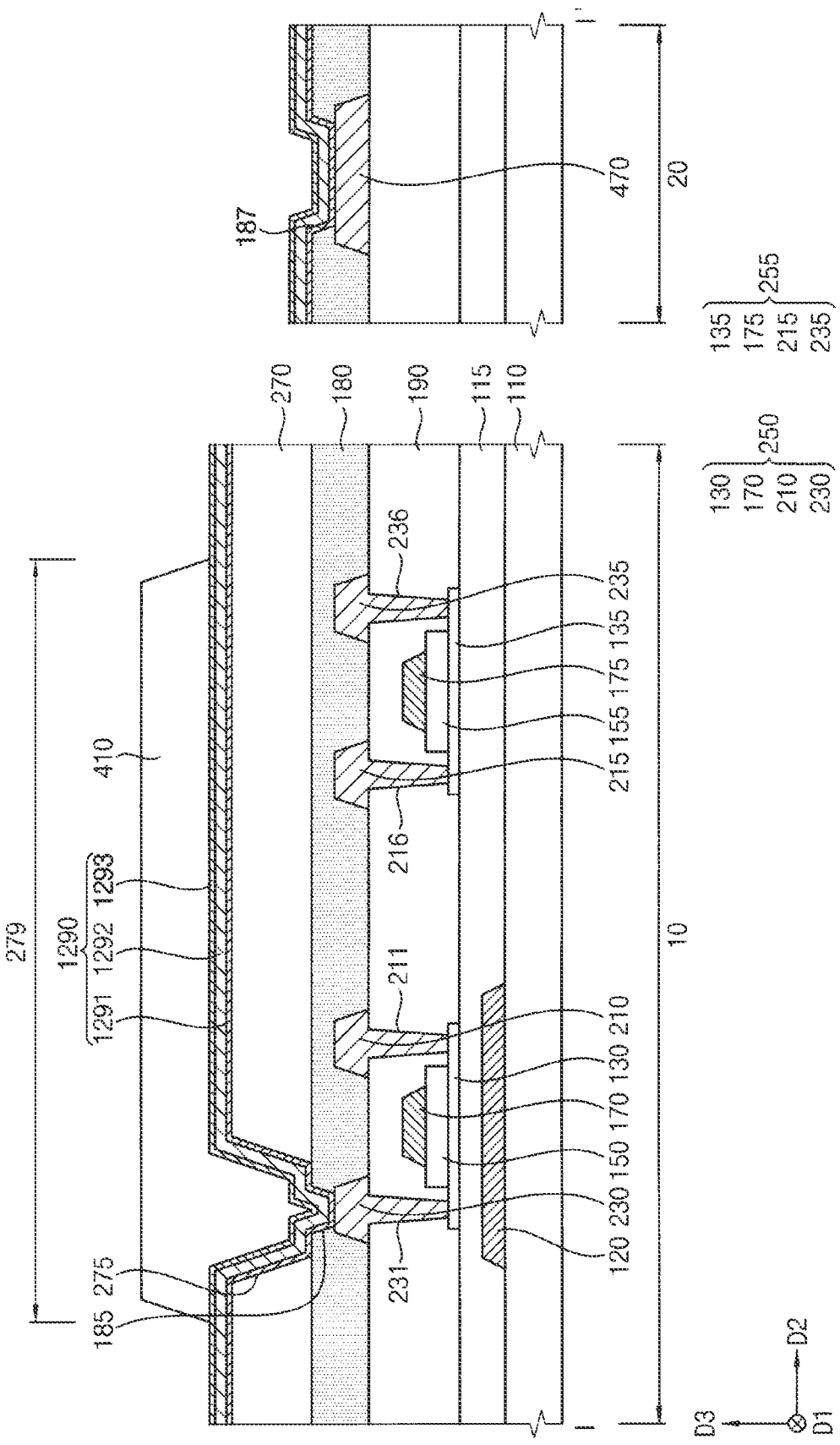

Referring to FIG. 14, a photoresist pattern 410 may be formed on one portion 279 of the display area 10 on the preliminary electrode layer 1290. The photoresist pattern 410 may cover the preliminary electrode layer 1290 in or at the third contact hole 275 and the first contact hole 185.

Figure 15:
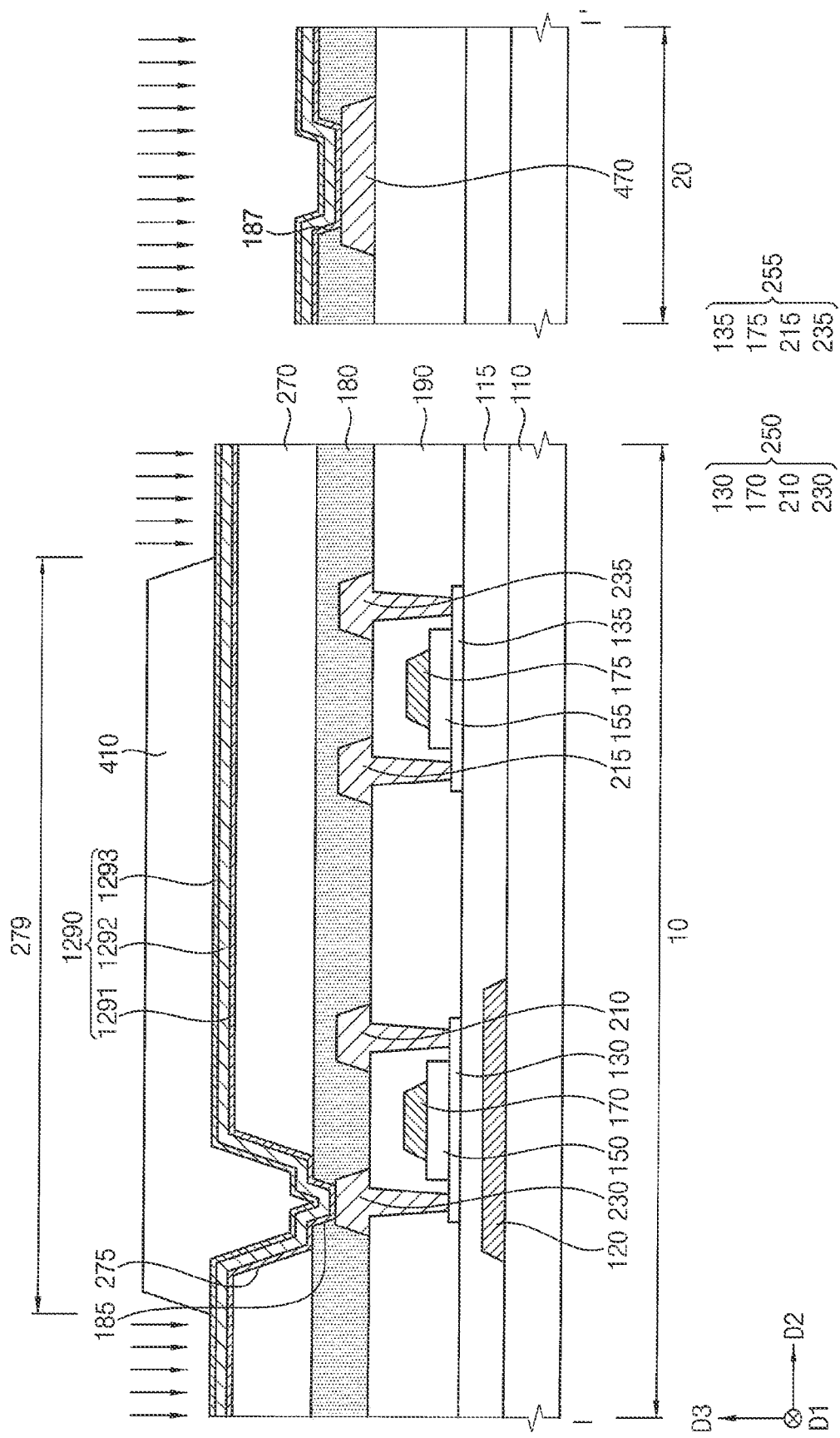
Figure 16:
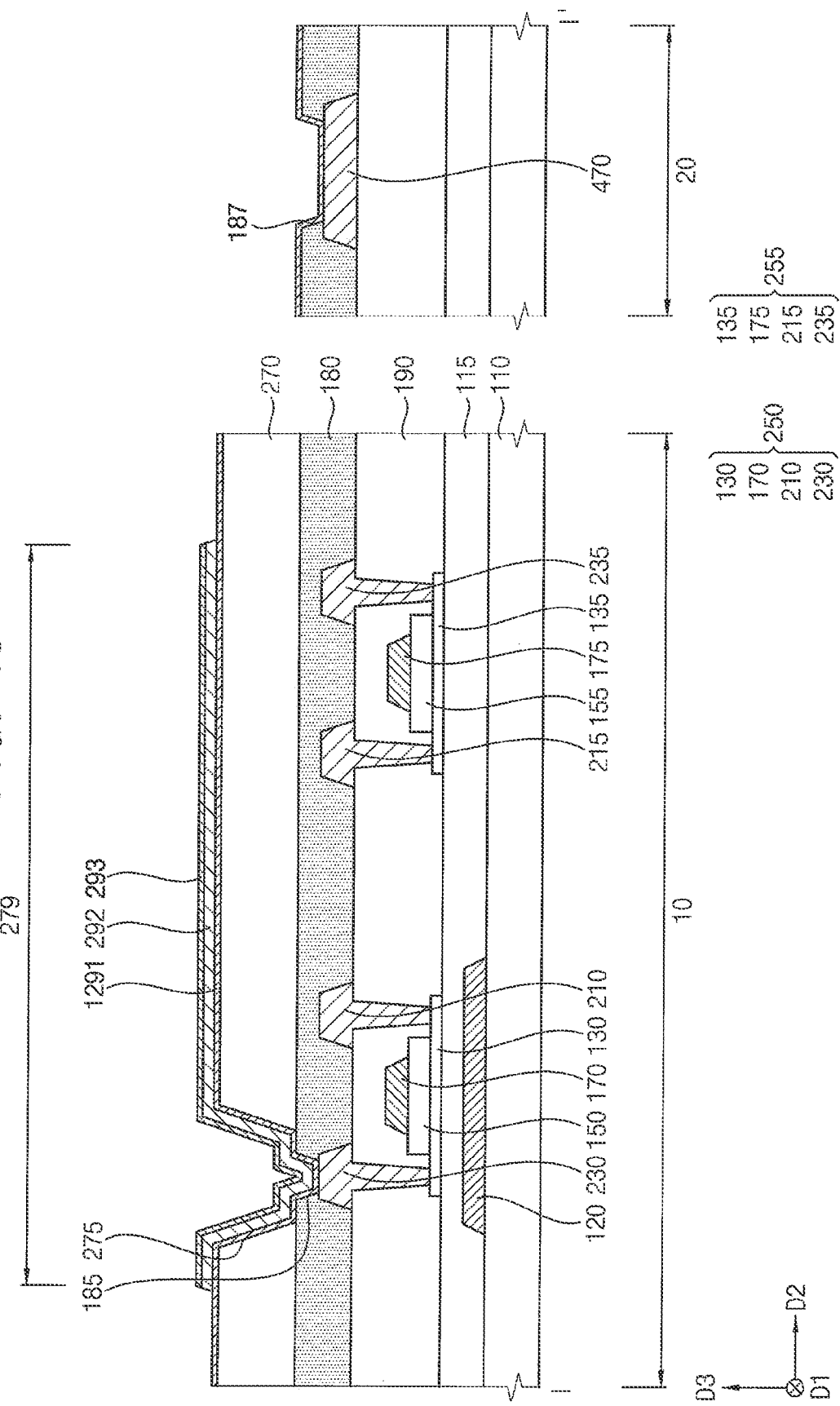

Referring FIGS. 15 and 16, the second electrode layer 1292 and the third electrode layer 1293 located in the remaining portion except for the preliminary electrode layer 1290 located in the one portion 279 of the display area 10 may be removed through a first etching process. In embodiments, the first etching process may be a wet etching process, and an etchant used in the first etching process may include a mixed solution including a phosphoric acid, an acetic acid, a nitric acid, and/or the like (e.g., a phosphoric-acetic-nitric acid). For example, in the first etching process, the first electrode layer 1291 includes Ti having a relatively low first etching rate, so that the first electrode layer 1291 may not be etched or not be substantially etched by the etchant. Accordingly, in a process of removing the second electrode layer 1292 and the third electrode layer 1293, the first electrode layer 1291 covers the pad electrode 470 so as not to expose the pad electrode 470, so that the etchant and the pad electrode 470 may not make contact with each other. In other words, the pad electrode 470 may not be corroded by the etchant. In other embodiments, the first electrode layer 1291 may be formed by using a metal (e.g., Ta or a transition metal) having a relatively low etching rate so as not to be etched or not to be substantially etched in the first etching process. In still other embodiments, an etching inhibition material may be added to the etchant so that the first electrode layer 1291 may not be etched or not be substantially etched in the first etching process.

Accordingly, the second electrode 292 and the third electrode 293 may be formed in the one portion 279 on the first electrode layer 1291 through the first etching process.

Figure 17:
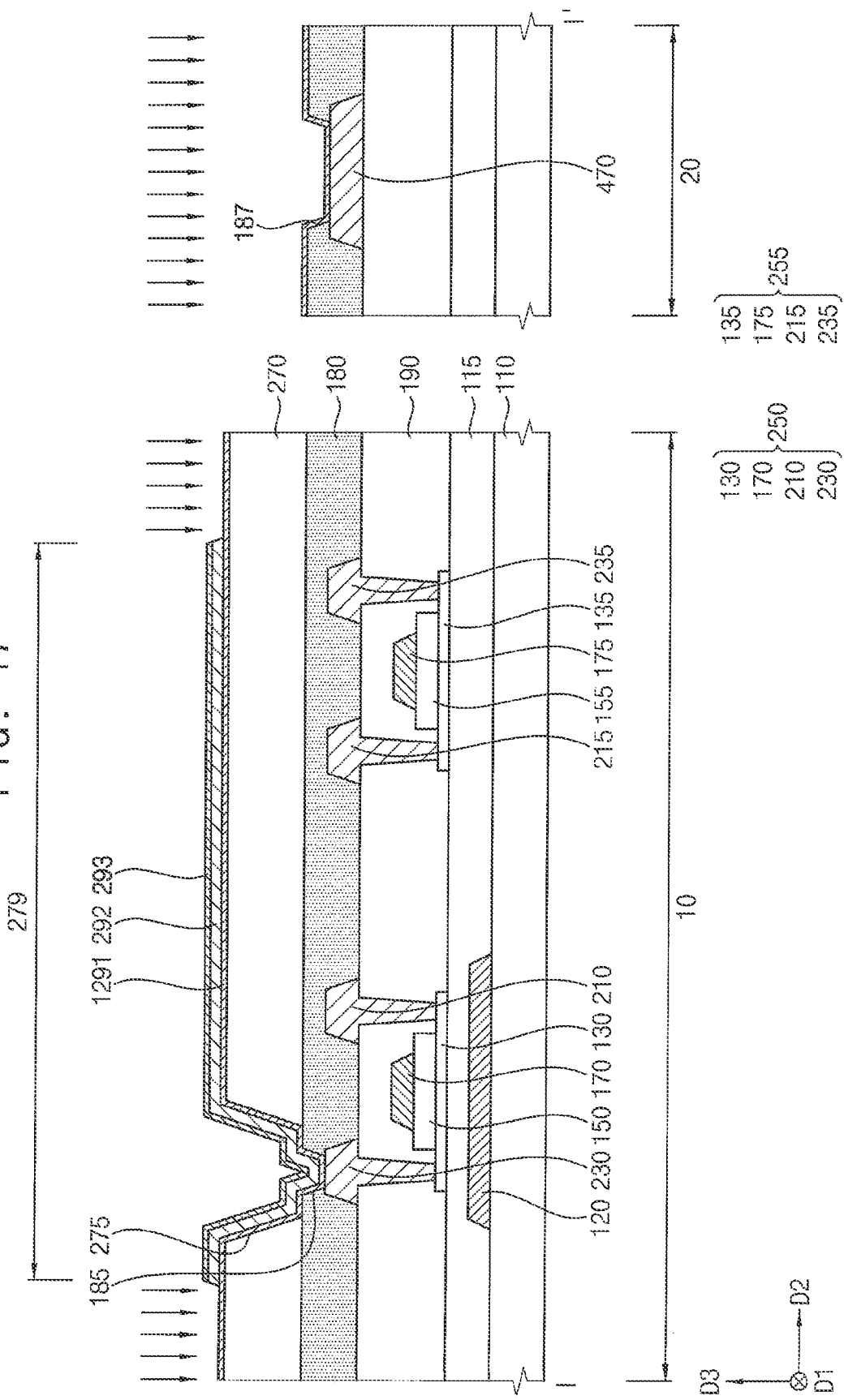

Referring to FIGS. 17 and 18, the first electrode layer 1291 located in the remaining portion except for the first electrode layer 1291 located in the one portion 279 may be removed through a second etching process. In embodiments, the second etching process may be a dry etching process. In addition, a part of the planarization layer 270 may be removed to form a protrusion 277 protruding in the third direction D3 during the second etching process. For example, the protrusion 277 may correspond to the one portion 279. In addition, the top surface of the pad electrode 470 may be exposed by removing the first electrode layer 1291 formed in the pad area 20.

Accordingly, the first electrode 291 may be formed on the one portion 279 through the second etching process, and the lower electrode 290 including the first electrode 291, the second electrode 292, and the third electrode 293 may be formed on the protrusion 277.

Referring to FIG. 2, the pixel defining layer 310 may be formed on a part of the lower electrode 290 in the display area 10. In other words, the pixel defining layer 310 may cover both side portions of the lower electrode 290, and may expose a part of a top surface of the lower electrode 290. The pixel defining layer 310 may include an organic material and/or an inorganic material. In embodiments, the pixel defining layer 310 may be formed by using an organic material (e.g., may be an organic layer).

The light emitting layer 330 may be formed on the lower electrode 290 exposed by the pixel defining layer 310. The light emitting layer 330 may be formed by using at least one of light emitting materials for emitting different color lights (e.g., red light, green light, blue light, etc.) according to sub-pixels. Alternatively, the light emitting layer 330 may be formed by stacking a plurality of light emitting materials for generating different color lights such as red light, green light, and blue light to emit white light as a whole. In this case, a color filter may be formed on the light emitting layer 330 (e.g., formed on a top surface of a thin film encapsulation structure formed on the upper electrode 340 to overlap the light emitting layer 330). The color filter may include at least one of a red color filter, a green color filter, or a blue color filter. In some embodiments, the color filter may include at least one of a yellow color filter, a cyan color filter, or a magenta color filter. The color filter may be formed by using a photosensitive resin, a color photoresist, and/or the like. In other embodiments, the light emitting layer 330 may emit blue light. In this case, an optical filter (e.g., a quantum dot layer and a scattering layer) may be formed on the light emitting layer 330, and the color filter may be formed on the optical filter.

The upper electrode 340 may be formed in the display area 10 on the pixel defining layer 310 and the light emitting layer 330. The upper electrode 340 may cover the light emitting layer 330 and the pixel defining layer 310, and may be formed over the light emitting layer 330 and the pixel defining layer 310 (e.g., the whole of the light emitting layer 330 and the pixel defining layer 310). The upper electrode 340 may by formed by using a metal, an alloy, metal nitride, conductive metal oxide, a transparent conductive material, and/or the like. These materials may be used alone or in combination with each other. In some embodiments, the upper electrode 340 may have a multilayer structure including a plurality of metal layers.

Accordingly, the pixel structure 200 including the lower electrode 290 (e.g., the lower electrode 290 including the first electrode 291, the second electrode 292, and the third electrode 293), the light emitting layer 330, and the upper electrode 340 may be formed, and the display device 100 shown in FIGS. 1-3 may be provided.

In the method of manufacturing the display device 100 according to embodiments of the present disclosure, the preliminary electrode layer 1290 has a stacked structure in which Ti, Ag, and ITO are stacked, so that the etchant used in the first etching process for forming the lower electrode 290 may not make contact with the pad electrode 470, and the pad electrode 470 may not be etched by the etchant.

The present disclosure may be applied to various electronic devices including a display device. For example, the present disclosure may be applied to numerous electronic devices such as a vehicle-display device, a ship-display device, an aircraft-display device, portable communication devices, display devices for display or for information transfer, a medical-display device, etc.

The foregoing is illustrative of embodiments and is not to be construed as limiting. Although a few embodiments have been described, those skilled in the art will readily appreciate that many modifications are possible in embodiments without materially departing from the novel teachings and features of the present disclosure. Accordingly, all such modifications are intended to be included within the scope of the present disclosure as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims, and equivalents thereof.

What is claimed is:

1. A display device comprising:
   a substrate comprising a display area and a pad area;
   a lower electrode in the display area on the substrate, the lower electrode comprising:
     a first electrode, the first electrode comprising titanium (Ti) and being formed by a first etching process,
     a second electrode on the first electrode, the second electrode comprising a first metal other than titanium (Ti) and being formed by a second etching process different from the first etching process, and
     a third electrode on the second electrode, the third electrode comprising a second metal other than titanium (Ti) and being formed by the second etching process,
   a light emitting layer over the first electrode;
   an upper electrode on the light emitting layer; and
   a pad electrode in the pad area on the substrate.

2. The display device of claim 1, wherein the first etching process is a dry etching process, and the second etching process is a wet etching process.

3. The display device of claim 2, wherein the first metal in the second electrode is silver (Ag).

4. The display device of claim 2, wherein the third electrode comprises indium tin oxide (ITO).

5. The display device of claim 1, wherein the pad electrode comprises:
   a first metal layer comprising titanium (Ti); and
   a second metal layer located on the first metal layer and comprising copper (Cu).

6. The display device of claim 5, wherein the pad electrode further comprises:
   a third metal layer located on the second metal layer and comprising indium tin oxide (ITO).

7. The display device of claim 1, further comprising:
   a protective insulating layer in the display area and the pad area between the substrate and the lower electrode.

8. The display device of claim 7, wherein the protective insulating layer exposes a part of a top surface of the pad electrode.

9. The display device of claim 1, further comprising:
   a planarization layer between the substrate and the lower electrode.

10. The display device of claim 9, wherein the planarization layer comprises a protrusion protruding in a direction from the substrate to the upper electrode.

11. The display device of claim 10, wherein the lower electrode is on the protrusion.

12. The display device of claim 1, further comprising:
    a semiconductor element between the substrate and the lower electrode; and
    a shielding metal layer between the semiconductor element and the substrate.

13. The display device of claim 12, wherein the semiconductor element comprises a metal oxide semiconductor layer, and
    wherein the shielding metal layer overlaps the metal oxide semiconductor layer.

14. A method of manufacturing a display device, the method comprising:
    providing a substrate comprising a display area and a pad area;
    forming a pad electrode in the pad area on the substrate;
    forming, on the substrate and the pad electrode, a preliminary electrode layer comprising a stacked structure in which a first electrode layer comprising titanium (Ti), a second electrode layer comprising a first metal other than titanium (Ti), and a third electrode layer comprising a second metal other than titanium (Ti) are sequentially stacked;
    removing the second and third electrode layers located in a first portion of the display area except for the preliminary electrode layer located in a second portion of the display area through a wet etching process;
    forming a lower electrode by removing the first electrode layer located in the first portion except for the preliminary electrode layer located in the second portion of the display area through a dry etching process;
    forming a light emitting layer on the lower electrode; and
    forming an upper electrode on the light emitting layer.

15. The method of claim 14, wherein the wet etching process utilizes an etchant comprising a phosphoric-acetic-nitric acid.

16. The method of claim 15, wherein the first metal in the second electrode layer is silver (Ag).

17. The method of claim 15, wherein the third electrode layer comprises indium tin oxide (ITO).

18. The method of claim 14, wherein the pad electrode comprises:
    a first metal layer comprising titanium (Ti); and
    a second metal layer located on the first metal layer and comprising copper (Cu).

19. The method of claim 18, wherein the pad electrode further comprises:
    a third metal layer located on the second metal layer and comprising indium tin oxide (ITO).

20. The method of claim 14, further comprising:
    forming a protective insulating layer in the display area and the pad area between the substrate and the lower electrode to expose a part of a top surface of the pad electrode;
    forming a planarization layer on the protective insulating layer;
    providing a second electrode and a third electrode to the second portion on the first electrode layer after the wet etching process is performed;
    forming a protrusion protruding in a direction from the substrate to the lower electrode by removing a part of the planarization layer during the dry etching process; and providing a first electrode to the second portion after the dry etching process is performed,
wherein the lower electrode comprising the first electrode, the second electrode, and the third electrode is formed on the protrusion.

* * * * *